United States Patent
Jang et al.

(10) Patent No.: US 9,412,712 B2
(45) Date of Patent: Aug. 9, 2016

(54) SEMICONDUCTOR PACKAGE AND METHOD OF MANUFACTURING THE SAME

(71) Applicant: Samsung Electronics Co., Ltd., Suwon-si (KR)

(72) Inventors: Jin-wook Jang, Asan-si (KR); Se-jin Yoo, Asan-si (KR); Sung-il Cho, Asan-si (KR); Jae-ho Choi, Cheonan-si (KR)

(73) Assignee: SAMSUNG ELECTRONICS, CO., LTD (KR)

( * ) Notice: Subject to any disclaimer, the term of this patent is extended or adjusted under 35 U.S.C. 154(b) by 0 days.

(21) Appl. No.: 14/722,742

(22) Filed: May 27, 2015

(65) Prior Publication Data

US 2016/0086898 A1 Mar. 24, 2016

(30) Foreign Application Priority Data

Sep. 22, 2014 (KR) ........................ 10-2014-0126053

(51) Int. Cl.
*H01L 23/48* (2006.01)
*H01L 23/00* (2006.01)
*H01L 23/498* (2006.01)
*H01L 23/31* (2006.01)
*H01L 25/065* (2006.01)

(52) U.S. Cl.
CPC ............ *H01L 24/09* (2013.01); *H01L 23/3135* (2013.01); *H01L 23/3142* (2013.01); *H01L 23/481* (2013.01); *H01L 23/49838* (2013.01); *H01L 24/17* (2013.01); *H01L 25/0657* (2013.01); *H01L 2224/16146* (2013.01); *H01L 2224/16227* (2013.01); *H01L 2225/06513* (2013.01); *H01L 2225/06517* (2013.01); *H01L 2225/06541* (2013.01)

(58) Field of Classification Search
CPC . H01L 24/09; H01L 23/3135; H01L 23/3142; H01L 23/481; H01L 23/49838; H01L 2224/16227; H01L 25/0657; H01L 2224/16146; H01L 2225/06541; H01L 2225/06517; H01L 2225/06513
See application file for complete search history.

(56) References Cited

U.S. PATENT DOCUMENTS

| | | | | |
|---|---|---|---|---|
| 5,381,599 A * | 1/1995 | Hall | ...................... | H01L 21/563 174/521 |
| 5,864,178 A * | 1/1999 | Yamada | ................ | H01L 21/563 257/737 |
| 6,369,451 B2 * | 4/2002 | Lin | ...................... | B23K 3/0607 257/737 |
| 6,849,477 B2 | 2/2005 | Hong et al. | | |
| 7,173,828 B2 | 2/2007 | Lin et al. | | |
| 7,829,453 B2 | 11/2010 | Jungnickel et al. | | |
| 8,237,276 B2 | 8/2012 | Song et al. | | |
| 8,252,631 B1 | 8/2012 | Jang et al. | | |

(Continued)

FOREIGN PATENT DOCUMENTS

| | | |
|---|---|---|
| JP | 08115947 | 5/1996 |
| JP | 2010034431 | 2/2010 |
| JP | 2010098098 | 4/2010 |

*Primary Examiner* — Yosef Gebreyesus
(74) *Attorney, Agent, or Firm* — Onello & Mello, LLP

(57) ABSTRACT

A semiconductor package includes a wiring substrate including a plurality of solder pads; a chip including a plurality of chip pads connected to the solder pads through a plurality of solders; a sealing layer configured to seal the chip and the solders, at least one void being between the solders; and a solder extrusion prevention layer on one sidewall of the solder exposed by the at least one void.

20 Claims, 19 Drawing Sheets

(56) References Cited

U.S. PATENT DOCUMENTS

| | | | |
|---|---|---|---|
| 8,357,565 B2* | 1/2013 | Ofner | H01L 21/563 257/E21.503 |
| 8,384,204 B2 | 2/2013 | Liu et al. | |
| 9,240,387 B2* | 1/2016 | Chen | H01L 24/32 |
| 2003/0193094 A1 | 10/2003 | Takahashi et al. | |
| 2007/0238220 A1* | 10/2007 | Lii | H01L 21/563 438/106 |
| 2009/0321961 A1* | 12/2009 | Lim | H01L 23/3164 257/778 |
| 2011/0128711 A1* | 6/2011 | Yim | H01L 21/563 361/760 |
| 2012/0267778 A1 | 10/2012 | Asami | |

* cited by examiner

SEMICONDUCTOR PACKAGE AND METHOD OF MANUFACTURING THE SAME

CROSS-REFERENCE TO RELATED APPLICATION

This application claims priority under 35 U.S.C. §119 to Korean Patent Application No. 10-2014-0126053, filed on Sep. 22, 2014, in the Korean Intellectual Property Office, the entire contents of which are hereby incorporated herein by reference.

FIELD OF THE INVENTION

The present disclosure relates to a semiconductor package. Specifically, the present disclosure relates to a flip chip assembly of a semiconductor package with improved reliability.

BACKGROUND

Flip chip assembly of semiconductors has increased in popularity due in part to the increased number of input and output terminals on the semiconductor. In such an assembly, a plurality of solder bumps are formed on a circuit side of the semiconductor ("chip"), the chip is attached to a wiring substrate with the solder bumps ("solders"), and a sealing (e.g. encapsulation) layer, such as an under-fill layer or molding layer is formed between the solder bumps. However, with decreased pitch between the solder bumps, (required to accommodate more bumps on a chip), a void or micro void may be formed between the bumps. When the solder bumps are reflowed to attach the chip to the package, the solder from adjacent bumps may cause a short circuit due to the void.

SUMMARY

The inventive concept provides for a semiconductor package capable of preventing adjacent solder bumps from being short-circuited when used or reflowed, even though voids are formed between the solder bumps when a chip having the solder bumps formed on a wiring substrate is mounted in a flip chip arrangement and then sealed.

The inventive concept provides a method of manufacturing the semiconductor package.

According to an aspect of the inventive concept, a semiconductor package comprises a wiring substrate including a plurality of solder pads; a chip including a plurality of chip pads connected to the solder pads through a plurality of solders; a sealing layer configured to seal the chip and the solders, at least one void being between the solders; and a solder extrusion prevention layer on one sidewall of the solder exposed by the at least one void.

The sealing layer comprises a molding layer between the solders and between the wiring substrate and the chip.

The sealing layer comprises an underfill layer between the solders and between the wiring substrate and the chip; and a molding layer on each of a plurality of sides of the chip circumscribing the underfill layer.

The solder extrusion prevention layer is on facing sidewalls of the solders exposed by the at least one void.

The semiconductor package further comprises a solder mask layer defined by the solder pads on the wiring substrate, wherein the solder extrusion prevention layer is on one sidewall of the solder mask layer contacting the at least one void.

The semiconductor package further comprises a solder mask layer on the wiring substrate and having an opening having a diameter that is larger than a diameter of the solder pad, wherein the at least one void is between the solder mask layer and the solder, and the solder extrusion prevention layer is on one sidewall of the solder pad exposed by the at least one void.

The solder extrusion prevention layer comprises a material having a higher melting point than the solder.

The solder extrusion prevention layer comprises an oxide layer or a nitride layer.

The chip is a first chip including a plurality of through-silicon vias, and a second chip is stacked on the first chip; the second chip is connected to the through-silicon vias through a plurality of second solders in a flip chip type.

The semiconductor package comprises a metal layer on the solder pad and the chip pad.

According to another aspect of the inventive concept, a semiconductor package comprises a wiring substrate including a plurality of first solder pads on a first surface of a substrate body, and a first solder mask layer having an opening to expose the plurality of first solder pads; a chip including an active surface facing the first surface of the substrate body and having a plurality of chip pads; a plurality of solders configured to connect the first solder pads to the respective chip pads; a sealing layer between the solders on the wiring substrate and between the wiring substrate and the chip configured to seal the chip, at least one void being between the solders; and a solder extrusion prevention layer on one sidewall of the solder exposed by the at least one void.

The opening has a smaller diameter than a diameter of the first solder pad, and the solder is circumscribed by the opening.

The solder extrusion prevention layer is on an inner wall of the opening adjacent to the at least one void.

The solder extrusion prevention layer is on facing sidewalls of the solders exposed by the at least one void and is on the inner wall of the opening adjacent to the at least one void.

The opening has a larger diameter than a diameter of the first solder pad, forming a gap portion wherein the first surface of the substrate body is not contacting the solder, and the sealing layer is on the substrate body of the gap portion between the first solder pad and the first solder mask layer.

The semiconductor package may further include a second solder pad exposed by a second solder mask layer on a second surface of the substrate body opposite to the first surface of the substrate body and connected to the first solder pad through an internal wiring line, wherein an external connection terminal is connected to the second solder pad.

The sealing layer comprises an underfill layer between the solders and between the wiring substrate and the chip; and a molding layer on the underfill layer and a plurality of sides of the chip.

The semiconductor package further comprises a rewiring layer on the underfill layer and the first surface of the substrate body and connected to a connection pad on the first surface of the substrate body, wherein a rewiring solder pad is in a portion of the rewiring layer, and an external connection terminal is connected to the rewiring solder pad.

According to another aspect of the inventive concept, a semiconductor package comprises a wiring substrate having a plurality of solder pads; a chip including a plurality of chip pads connected to the solder pads through a plurality of solders; a sealing layer between the solders on the wiring substrate and between the wiring substrate and the chip to seal the chip, at least one void being between the solders; a solder extrusion prevention layer exposed by the at least one void and on one sidewall of the solder; and a solder protection layer not exposed by the at least one void and on the other sidewall of the solder.

The solder extrusion prevention layer is thicker than the solder protection layer.

The solder protection layer is in contact with the sealing layer.

The solder extrusion prevention layer comprises a material having a higher melting point than the solder, and the solder extrusion prevention layer comprises an oxide layer or a nitride layer.

According to another aspect of the inventive concept, a method of manufacturing a semiconductor package comprises preparing a wiring substrate including a plurality of solder pads; preparing a chip including a plurality of chip pads and a plurality of solders formed on the chip pads; mounting the solders of the chip to the respective solder pads of the wiring substrate; forming a sealing layer sealing the chip mounted on the wiring substrate, at least one void being formed between the solders; and forming a solder extrusion prevention layer on one sidewall of the solder exposed to the at least one void.

The sealing layer is formed between the solders and between the wiring substrate and the chip.

The sealing layer comprises a molding material injected at one side of the wiring substrate.

The sealing layer comprises an underfill layer formed between the solders and between the wiring substrate and the chip; and a molding layer formed on each of a plurality of sides of the chip circumscribing the underfill layer Forming of the solder extrusion prevention layer comprises loading, into a chamber, the chip which is mounted on the wiring substrate wherein at least one void is formed between the solders; and pressurizing at least one void by adjusting a temperature of the chamber to below a melting point of the solder and maintaining the chamber at a higher pressure than an atmospheric pressure.

The solder extrusion prevention layer is formed on facing sidewalls of the solders exposed by the at least one void.

The solder extrusion prevention layer comprises an oxide layer formed by oxidizing the solder exposed by the at least one void.

Forming the solder extrusion prevention layer comprises loading, into a chamber, the chip mounted on the wiring substrate wherein at least one void is formed between the solders; and injecting a reaction gas into the chamber to form the solder extrusion prevention layer on the solder exposed by the at least one void.

The solder extrusion prevention layer comprises a nitride layer formed on the solder.

The solder extrusion prevention layer comprises a material having a higher melting point than the solder.

The method further comprises annealing the solders, the sealing layer, and the solder extrusion prevention layer, after forming the solder extrusion prevention layer.

According to another aspect of the inventive concept, a method of manufacturing a semiconductor package comprises attaching a plurality of solders of a chip to a respective plurality of solder pads of a substrate. A sealing layer is formed between the solders, at least one void being formed between the solders. A solder extrusion prevention layer is formed on a respective sidewall of each of the solders exposed to the at least one void.

Forming the solder extrusion prevention layer includes reacting a gas to each of the respective sidewalls exposed to the at least one void, the gas and each of the respective sidewalls being at an elevated pressure and an elevated temperature.

The elevated pressure is higher than an atmospheric pressure.

The elevated temperature is less than a melting point of the solders.

Each of the solders, each of the solder extrusion layers and the sealing layer are annealed after forming each of the solder extrusion prevention layers.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1:
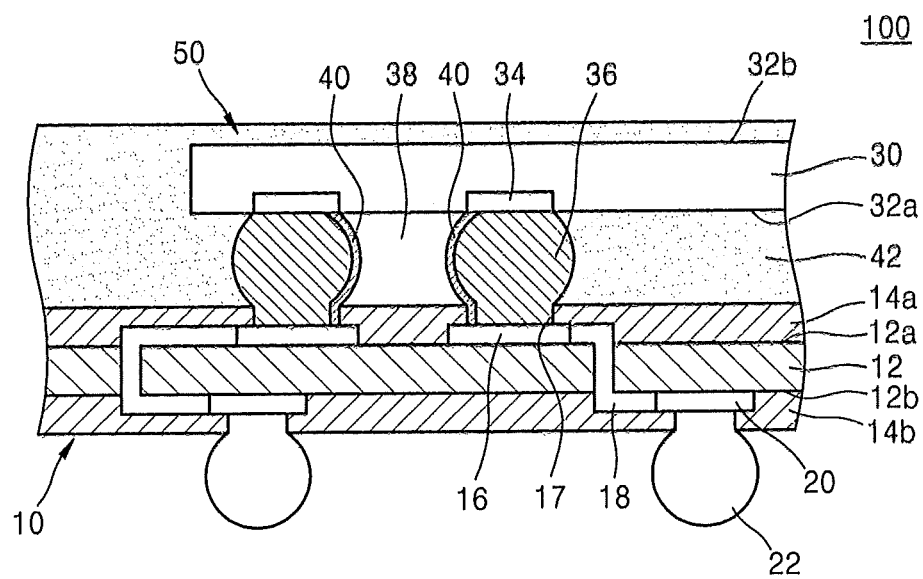
FIG. 1 and FIG. 2 are partial cross-sectional views of a semiconductor package according to an embodiment of the inventive concept.

Hereinafter, exemplary embodiments of the inventive concept will be described in detail with reference to the accompanying drawings.

The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated for clarity of the inventive concept.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

Also, though terms "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

With reference to FIG. 1 through FIG. 3C, the semiconductor package 100 according to the embodiment of the inventive concept may include a wiring substrate 10, a chip 50, a solder 36, and a sealing layer (e.g. encapsulation layer) 42. The wiring substrate 10 may be a printed circuit board (PCB). In the wiring substrate 10, a plurality of first solder pads 16 separate from one another and a first solder mask layer 14a may be formed on a first surface 12a of a substrate body 12.

The substrate body 12 may include resins or photosensitive liquid dielectrics, photosensitive dry-film dielectrics, polyimide flexible film, thermally cured dry films, thermally cured liquid dielectrics, resin coated copper foil (RCC), thermoplastic or flexible resins. The substrate body 12 may include a ceramic. The listed materials of the substrate body 12 are only for illustrative purposes and the embodiment 100 is not limited thereto.

The first solder pad 16 may include an aluminium layer or a copper layer. The first solder mask layer 14a may include a photo solder resist capable of being patterned through a photo process.

Figure 3A:
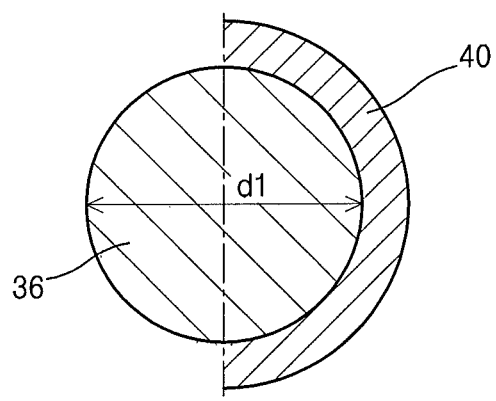
FIG. 3A is a plan view of a solder and a solder extrusion prevention layer of FIG. 1 and FIG. 2.
Figure 3B:
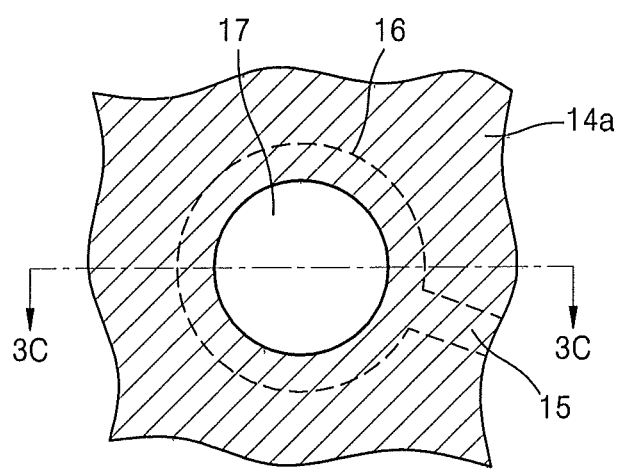
FIG. 3B is a plan view of a solder pad and a solder mask layer of FIG. 1 and FIG. 2.
Figure 3C:
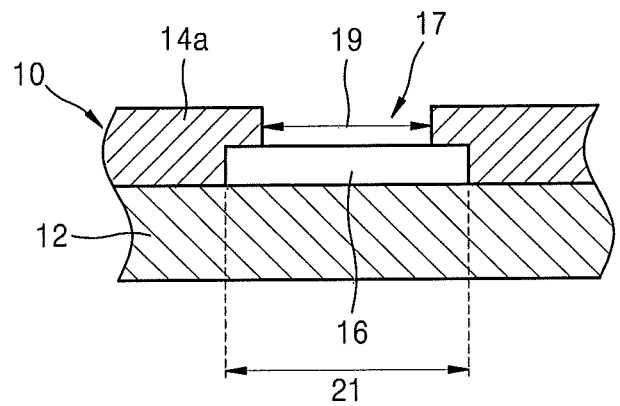
FIG. 3C is a cross-sectional view taken along line 3c-3c of FIG. 3B.

Generally, the first solder pad 16 may be defined by the first solder mask layer 14a. Specifically, an opening 17 on the first solder pad 16 may be defined by the first solder mask layer 14a as illustrated in FIG. 3B and FIG. 3C. The opening 17 may be a portion that is opened by the first solder mask layer 14a. As illustrated in FIG. 3B and FIG. 3C, a diameter 19 of the opening 17 may be smaller than a diameter 21 of the first solder pad 16.

Figure 2:
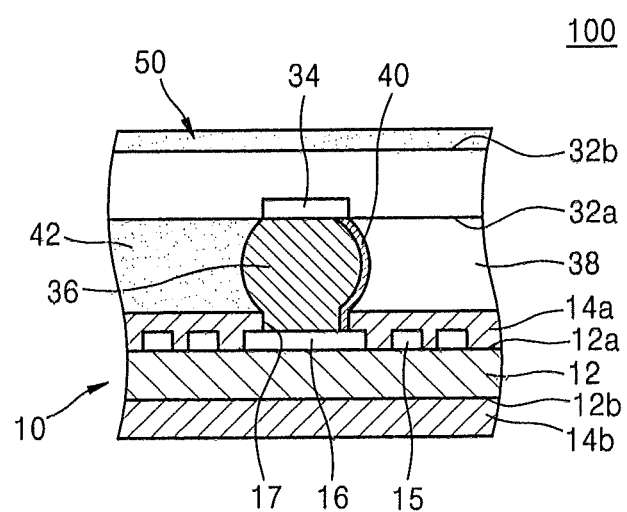

The first solder pad 16 may be connected to an internal wiring line 18 inside the substrate body 12. As illustrated in FIG. 2, the first solder pad 16 may be flush with an external wiring line 15 on the first surface 12a of the substrate body 12. As illustrated in FIG. 3B, the first solder pad 16 may be connected to the external wiring line 15.

The chip 50, which is connected through a plurality of solders 36, may be mounted on the plurality of first solder pads 16. The chip 50 may be a semiconductor chip that performs various functions, such as a memory, a logic device, a microprocessor, an analog device, a digital signal processor, or a system-on-chip. The chip 50 may include a chip body 30 and a plurality of chip pads 34 separate from one another on a first surface 32a of the chip body 30, that is, an active surface (e.g. circuit formation surface) 32a of the chip body 30.

The chip pads 34 and the first solder pads 16 may be connected together by the solders 36. The solders 36 may also be referred to as solder balls or solder bumps. The solders 36 may include an Sn—Ag—Cu-based metal, an Sn—Ag-based metal, an Sn—Bi-based metal, an Sn—Cu-based metal or an Sn—Zn-based metal. According to an embodiment, the solders 36 may include an Sn—Ag—Cu-based metal, the primary component of which is tin (Sn), but the inventive concept is not limited thereto.

As illustrated in FIG. 1 and FIG. 2, the solder 36 may be formed by filling the opening 17 on the first solder pad 16. The solder 36 may be formed in contact with the first solder mask layer 14a. As illustrated in FIG. 3A, the solder 36 may have a diameter of d1. The first solder pad 16 and the chip pad 34 may be connected to each other in an electrical and mechanical manner. Mounting and connecting the chip 50 on the wiring substrate 10, such that the first surface 32a of the chip body 30, (e.g. the active surface 32a of the chip body 30), is directed downward, may be referred to as a flip chip type mounting and connection.

A sealing layer 42 may be formed to seal the solders 36 and the chip 50 on the wiring substrate 10. The sealing layer 42 may be a molding layer formed between the wiring substrate 10 and the chip 50. The molding layer may include a polymer such as a resin. For example, the molding layer may include an epoxy molding compound (EMC).

As described below, the sealing layer 42 may be formed between the solders 36. The sealing layer 42 may be formed to cover the first surface 32a of the chip body 30 and a second surface 32b opposite to the first surface 32a, (e.g. an inactive surface on which no circuit is formed). As described below, the sealing layer 42 may not cover the second surface 32b of the chip body 30, but may leave the second surface 32b partially or fully exposed.

As described below, in the sealing layer 42, at least one void 38 may be formed between the solders 36 due to the package manufacturing process (e.g. a molding process or an underfill process). The void 38 (e.g. micro void) may be a portion in which the sealing layer 42 is not formed between the solders 36. The void 38 may be formed in an entire space between the solders 36 as illustrated in FIG. 1, but may be formed in only a partial space between the solders 36 according to the package manufacturing process.

A solder extrusion prevention layer 40 may be formed on one sidewall of the solder 36 exposed by the void 38. As illustrated in FIG. 3A, the solder extrusion prevention layer 40 may be formed along a periphery of one side of the solder 36.

The solder extrusion prevention layer 40 may be formed on only one sidewall of one selected from among the solders 36 exposed by the void 38. As illustrated in FIG. 1, the solder extrusion prevention layer 40 may be formed on all facing sidewalls of the solders 36 exposed by the void 38. The solder extrusion prevention layer 40 may be formed on an inner wall of the opening 17 adjacent to the void 38. The solder extrusion prevention layer 40 may be formed on the entire inner wall of the opening 17 adjacent to the void 38.

The solder extrusion prevention layer 40 may include a material, of which a melting point is higher than the solder 36, for example, an Sn—Ag—Cu-based metal. For example, the solder extrusion prevention layer 40 may include an oxide layer or a nitride layer. Specifically, the melting point of the solder 36, (e.g. the Sn—Ag—Cu-based metal), may be about 220° C., and the melting point of the solder extrusion prevention layer 40, (e.g. the oxide layer or the nitride layer), may be about 1,000° C. or higher.

Therefore, even though the solder 36 is melted during the formation of the semiconductor package 100, the solder extrusion prevention layer 40 may prevent the solders 36 from being short-circuited. The short circuit may be a low impedance short or in some instances a relatively high impedance whisker short where only a partial electrical bridge is formed between adjacent solders 36.

Because the melting point of the solder extrusion prevention layer 40 is higher than the melting point of the solder 36, the solder 36 is not extruded to the outside even when the solder 36 is melted. Consequently, it is possible to prevent the solders 36 from being short-circuited and to prevent the solder 36 and the external wiring line 15 from being short-circuited. For example, when the solder extrusion prevention layer 40 is an oxide layer, the melting point of the solder extrusion prevention layer 40 is about 1,000° C. or higher. Thus, even when the solder 36 is melted, the solder 36 may not be extruded to the outside.

A second solder pad 20 and a second solder mask layer 14b may be formed on the second surface 12b opposite to the first surface 12a of the substrate body 12. The second solder pad 20 may include an aluminium layer or a copper layer. The second solder mask layer 14b may include a photo solder resist capable of being patterned through a photo process.

The second solder pad 20 may be opened by the second solder mask layer 14b and be connected to the first solder pad 16 through the internal wiring line 18. An external connection terminal 22 may be formed in the second solder pad 20. The external connection terminal 22 may include the same material as that described above.

Figure 4:
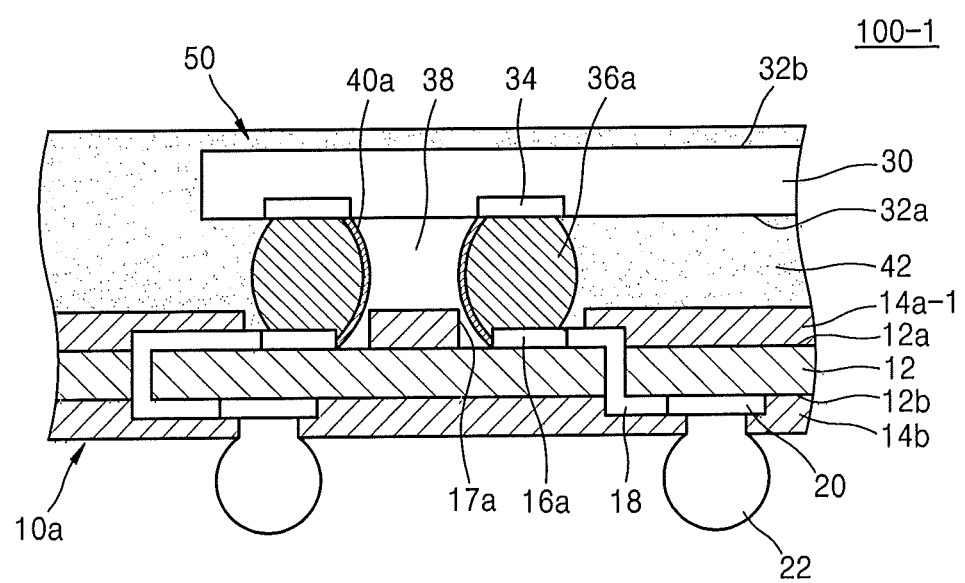
FIG. 4 and FIG. 5 are partial cross-sectional views of a semiconductor package according to an embodiment of the inventive concept.
Figure 5:
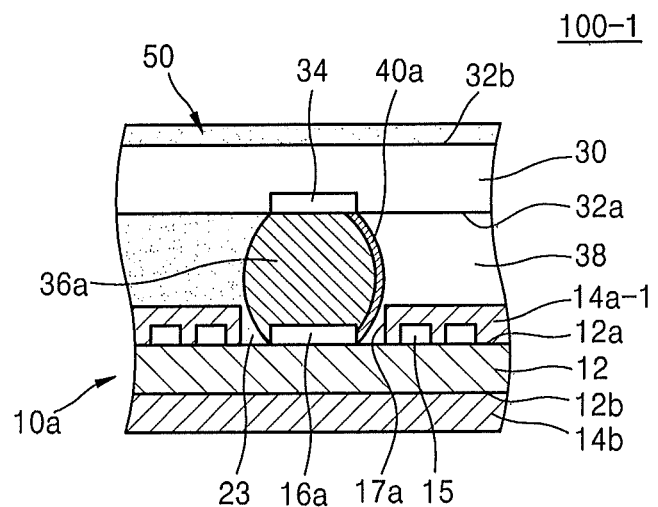

The semiconductor package 100-1 of FIG. 4, FIG. 5 and FIG. 6 is similar to the semiconductor package 100 of FIG. 1, FIG. 2 and FIG. 3, with the exception of a first solder mask layer 14a-1, a first solder pad 16a, an opening 17a, a solder 36a, and a solder extrusion prevention layer 40a. Therefore the elements of FIG. 4, FIG. 5 and FIG. 6 that are similar to those of FIG. 1, FIG. 2 and FIG. 3 will not be described or will be described briefly.

The semiconductor package 100-1 according to the embodiment of the inventive concept may include a wiring substrate 10a, a chip 50a, a solder 36a, and a sealing layer 42. In the wiring substrate 10a, a plurality of first solder pads 16a separate from one another and a first solder mask layer 14a-1 may be formed on a first surface 12a of a substrate body 12.

Figure 6A:
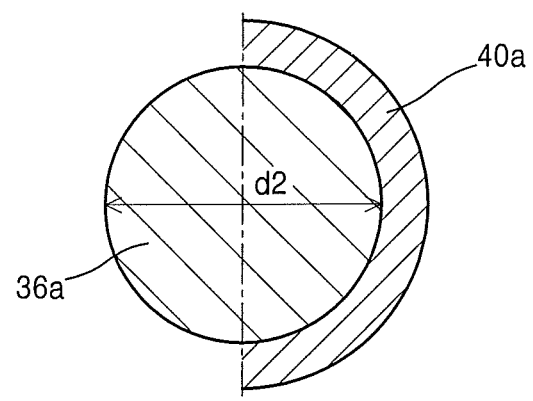
FIG. 6A is a plan view of a solder and a solder extrusion prevention layer of FIG. 4 and FIG. 5.
Figure 6B:
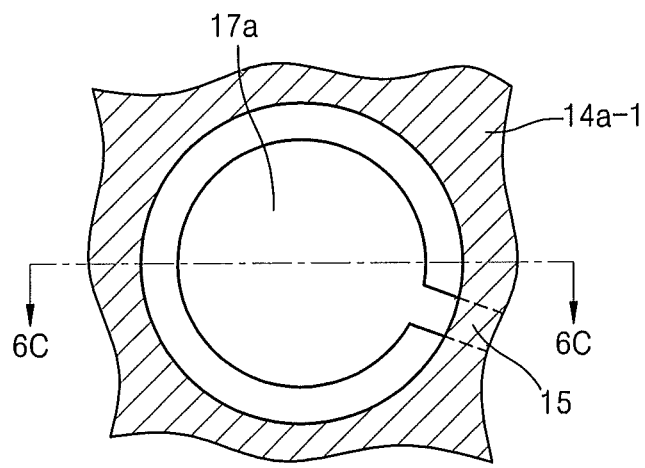
FIG. 6B is a plan view of a solder pad and a solder mask layer of FIG. 4 and FIG. 5.
Figure 6C:
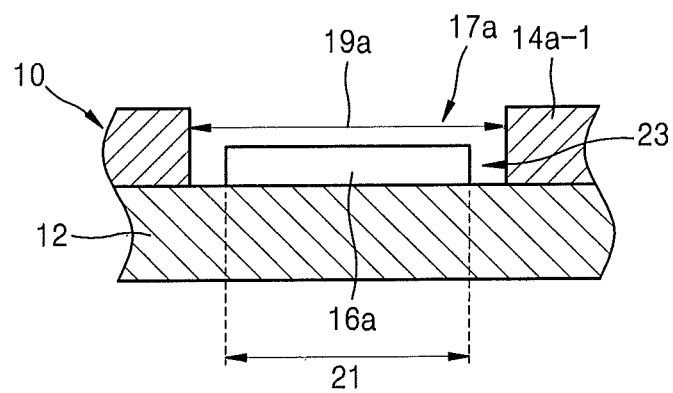
FIG. 6C is a cross-sectional view taken along line 6c-6c of FIG. 6B.

Generally, the first solder pad 16a may not be defined by the first solder mask layer 14a-1. Specifically, an opening 17a disposed on the first solder pad 16a may not be defined by the first solder mask layer 14a-1 as illustrated in FIG. 6B and FIG. 6C. The opening 17a may be a portion that is opened by the first solder mask layer 14a-1. As illustrated in FIG. 6B and FIG. 6C, a diameter 19 of the opening 17a may be larger than a diameter 21 of the first solder pad 16. The opening 17a may expose the first surface 12a of the substrate body 12.

The first solder pad 16a may be connected to an internal wiring line 18 formed inside the substrate body 12. As illustrated in FIG. 5, the first solder pad 16a may be flush with an external wiring line 15 formed on the first surface 12a of the substrate body 12. As illustrated in FIG. 6B, the first solder pad 16a may be connected to the external wiring line 15.

The chip 50, which is connected through a plurality of solders 36a, may be mounted on the plurality of first solder pads 16a. The chip 50 may include a chip body 30 and a plurality of chip pads 34 separate from one another on a first surface 32a of the chip body 30, that is, an active surface (e.g. circuit formation surface) 32a of the chip body 30. The chip pads 34 and the first solder pads 16a may be connected together by the solders 36a.

As illustrated in FIG. 4 and FIG. 5, the solder 36a may not fully fill the opening 17a disposed on the first solder pad 16a, The solder 36a may not be formed in contact with the first solder mask layer 14a-1. As illustrated in FIG. 6A, the solder 36a may have a diameter of d2. The diameter d2 of the solder 36a may be larger than the diameter d1 of the first solder pad 16. The first solder pad 16a and the chip pad 34 may be connected to each other in an electrical and mechanical manner.

A sealing layer 42 may be formed to seal the solders 36a and the chip 50 formed on the wiring substrate 10a. As illustrated in FIG. 4 and FIG. 5, the sealing layer 42 may be formed on the substrate body 12 of a gap portion 23 between the first solder pad 16a and the first solder mask layer 14a-1. Because the sealing layer 42 and the substrate body 12 have a good adhesive property, the sealing layer 42 may tightly support the solder 36a and may prevent the solder 36a and the adjacent external wiring line 15 from being short-circuited.

The sealing layer 42 may include a molding layer or an underfill layer formed between the wiring substrate 10a and the chip 50. As described below, the sealing layer 42 may be formed between the solders 36a. The sealing layer 42 may be formed to cover the first surface 32a of the chip body 30 and a second surface 32b opposite to the first surface 32a, (e.g. an inactive surface on which no circuit is formed). As described below, the sealing layer 42 may not cover entirely the second surface 32b of the chip body 30.

As described below, in the sealing layer 42, at least one void 38 may be formed between the solders 36a due to the package manufacturing process, (e.g. a molding process or an underfill process). The void 38 (e.g. micro void) may be a portion in which the sealing layer 42 is not formed between the solders 36a. The void 38 may be formed in an entire space between the solders 36a as illustrated in FIG. 4, but may be formed in only a partial space between the solders 36a according to the package manufacturing process. As illustrated in FIG. 5, the void 38 may also be formed between the first solder mask layer 14a-1 and the solder 36a.

A solder extrusion prevention layer 40a may be formed on one sidewall of the solder 36a exposed by the void 38. As illustrated in FIG. 6A, the solder extrusion prevention layer 40a may be disposed along a periphery of one side of the solder 36a. As illustrated in FIG. 5, the solder extrusion prevention layer 40a may be formed on one sidewall of the solder pad 16a exposed by the void 38.

The solder extrusion prevention layer 40a may be formed on only one sidewall of one selected from among the solders 36a exposed by the void 38. As illustrated in FIG. 4, the solder extrusion prevention layer 40a may be formed on all facing sidewalls of the solders 36a exposed by the void 38. The solder extrusion prevention layer 40a may include a material, of which a melting point is higher than the solder 36, (e.g. an oxide layer or a nitride layer). Therefore, even though the solder 36a is melted when the semiconductor package 100-1 is formed, the solder extrusion prevention layer 40a may prevent the solders 36a from being short-circuited.

In other words, since the melting point of the solder extrusion prevention layer 40a is higher than the melting point of the solder 36a, the solder 36a is not extruded to the outside even when the solder 36a is melted, Consequently, it is possible to prevent the solders 36a from being short-circuited and to prevent the solder 36a and the external wiring line 15 from being short-circuited. Furthermore, since the solder 36a does not contact the first solder mask layer 14a-1, it is possible to prevent short-circuit between the solders 36a and short-circuit between the solder 36a and the external wiring line 15.

A second solder pad 20 and a second solder mask layer 14b may be formed on the second surface 12b opposite to the first surface 12a of the substrate body 12. The second solder pad 20 may be opened by the second solder mask layer 14b and be connected to the first solder pad 16 through the internal wiring line 18. An external connection terminal 22 may be formed in the second solder pad 20. The external connection terminal 22 may include the same material as that described above.

Figure 7:
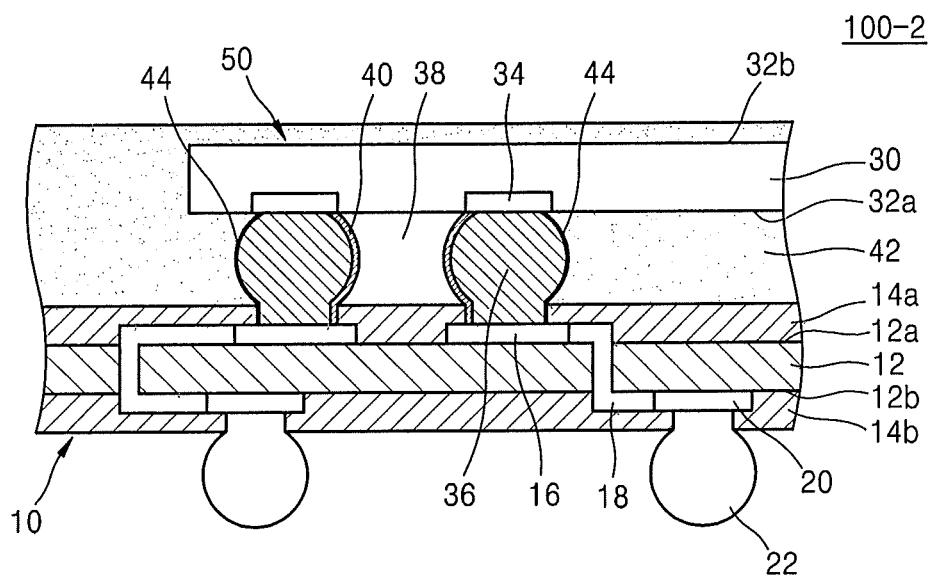
FIG. 7 is a cross-sectional view of a semiconductor package according to an embodiment of the inventive concept.
Figure 8:
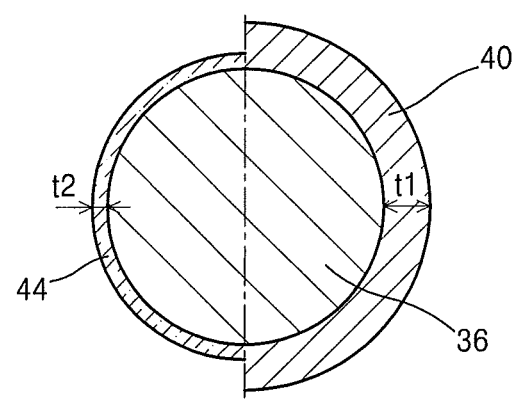
FIG. 8 is a plan view of a solder, a solder extrusion prevention layer, and a solder protection layer of FIG. 7.

The semiconductor package 100-2 of FIG. 7 and FIG. 8 is similar to the semiconductor package 100 of FIG. 1, FIG. 2 and FIG. 3, with the exception of a solder protection layer 44. Therefore, the elements of FIG. 7 and FIG. 8 that are similar to those of FIG. 1, FIG. 2 and FIG. 3 will not be described or will be described briefly.

The semiconductor package 100-2 may include a wiring substrate 10, a chip 50, a solder 36, and a sealing layer 42. A plurality of solder pads 16 and a first solder mask layer 14a may be formed on a first surface 12a of a substrate body 12 constituting the wiring substrate 10.

The first solder pad 16 may be connected to an internal wiring line 18 formed inside the substrate body 12. The chip 50, which is connected through a plurality of solders 36, may be mounted on the plurality of first solder pads 16. The chip 50 may include a chip body 30 and a plurality of chip pads 34 on a first surface 32a (e.g. an active surface) of the chip body 30. The chip pads 34 and the first solder pads 16 may be connected together by the solders 36.

The solder 36 may be formed in contact with the first solder mask layer 14a. A sealing layer 42 may be formed to seal the solders 36 and the chip 50 formed on the wiring substrate 10. The sealing layer 42 may be formed to cover the first surface 32a of the chip body 30 and a second surface 32b opposite to the first surface 32a (e.g. an inactive surface on which no circuit is formed).

As described below, in the sealing layer 42, at least one void 38 may be formed between the solders 36 due to the attribute of a package manufacturing process (e.g. a molding process or an underfill process).

A solder protection layer 44 may be formed on the other sidewall of the solder 36 that is not exposed by the void 38. The solder protection layer 44 may be formed in contact with the sealing layer 42. The solder protection layer 44 may be formed in a molding process or a package manufacturing process. As illustrated in FIG. 8, the solder protection layer 44 may be formed to have a thickness of t2. The solder extrusion prevention layer 40 may include a material, with a melting point higher than the solder 36, (e.g. an oxide layer or a nitride layer).

A solder extrusion prevention layer 40 may be formed on one sidewall of the solder 36 exposed by the void 38. As illustrated in FIG. 8, the solder extrusion prevention layer 40 may be formed along a periphery of one side of the solder 36 and have a thickness of t1. The solder extrusion prevention layer 40 may include a material, with a melting point higher than the solder 36, (e.g. an oxide layer or a nitride layer).

Even though the solder 36 is melted when the semiconductor package 100-2 is formed, the solder extrusion prevention layer 40, which is thicker than the solder protection layer 44, may prevent the solders 36 from being short-circuited. Because the solder extrusion prevention layer 40 has a melting point higher than that of the solder 36 and is thicker than the solder protection layer 44, the solder 36 is not extruded to the outside even when the solder 36 is melted. Consequently, it is possible to prevent the solders 36 from being short-circuited and to prevent the solder 36 and the external wiring line 15 from being short-circuited.

A second solder pad 20 and a second solder mask layer 14b may be formed on the second surface 12b opposite to the first surface 12a of the substrate body 12. The second solder pad 20 may be connected to the first solder pad 16 through the internal wiring line 18. An external connection terminal 22 may be formed in the second solder pad 20. The external connection terminal 22 may be a solder.

Figure 9:
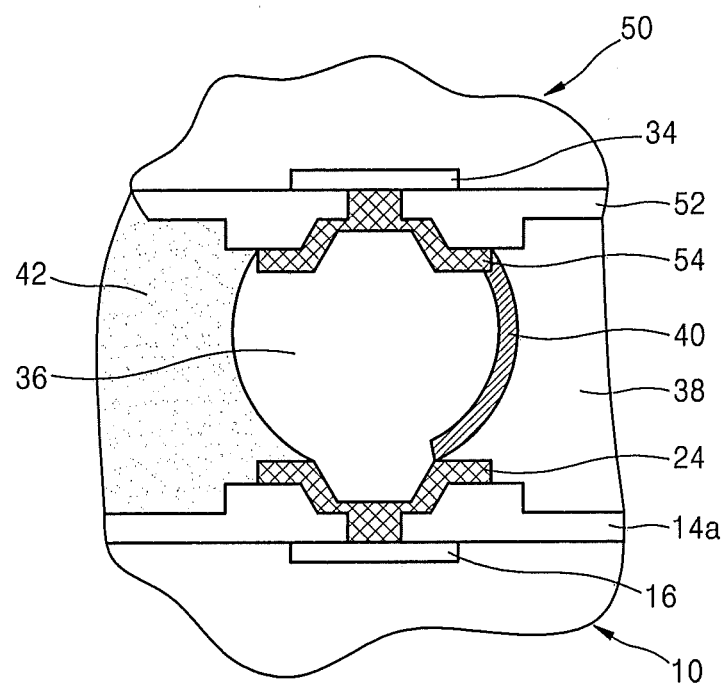
FIG. 9 is a cross-sectional view illustrating a connection relationship between a wiring substrate of a semiconductor package and a chip, according to an embodiment of the inventive concept.

With reference to FIG. 9, the semiconductor packages 100 and 100-1 may include the wiring substrate 10, the chip 50, the solder 36, and the sealing layer 42. The first solder pad 16 and the first solder mask layer 14a may be formed on the wiring substrate 10. The chip pad 34 and a passivation layer 52 may be formed in the chip 50.

As described above, the first solder pad 16 and the chip pad 34 may be connected together by the solder 36. Metal layers 24 and 54 may be formed on the first solder pad 16 and the chip pad 34, respectively. When the solder 36 is formed on the metal layers 24 and 54, the electrical and mechanical connection through the solder 36 may be facilitated.

When the sealing layer 42 is not properly formed in the molding process and thus the void 38 is formed, the solder extrusion prevention layer 40 may be formed on one sidewall of the solder 36 exposed by the void 38. The solder extrusion prevention layer 40 may also be formed on the metal layers 24 and 54 exposed by the void 38.

Figure 10:
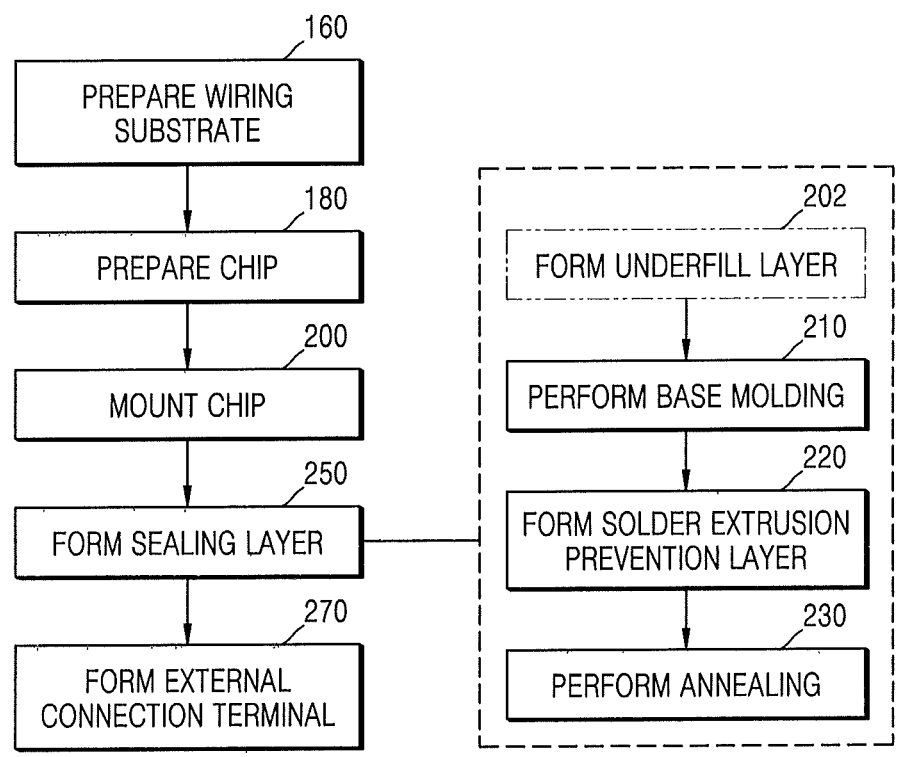
FIG. 10 is a flowchart of a method of manufacturing a semiconductor package, according to an embodiment of the inventive concept.

With reference to FIG. 10, a flowchart of a method of manufacturing a semiconductor package includes a process 160 of preparing a wiring substrate, a process 180 of preparing a chip, a process 200 of mounting the chip, a process 250 of forming a sealing layer, and a process 270 of forming an external connection terminal.

The process 160 of preparing a wiring substrate may be preparing a wiring substrate 10 (or 10a) of FIG. 1 through FIG. 9. As described above, the wiring substrate 10 (or 10a) may include a plurality of solder pads 16 (or 16a) of FIG. 1 through FIG. 9 separate from one another.

The process 180 of preparing a chip may be preparing a chip 50 of FIG. 1 through FIG. 9. As described above, the chip 50 may include a plurality of chip pads 34 of FIG. 1 through FIG. 9 separate from one another, and a plurality of solders 36 (or 36a) of FIG. 1 through FIG. 9 formed in the chip pads 34.

The process 200 of mounting the chip may be mounting the chip 50 on the wiring substrate 10 (or 10a). The solders 36 (or 36a) of the chip 50 may be mounted in a flip chip type such that the solders 36 (or 36a) correspond on the solder pads of the wiring substrate 10 (or 10a) of FIG. 1 through FIG. 9.

After the process 200 of mounting the chip, a sealing layer may be formed by sealing the chip 50 mounted on the wiring substrate 10 (or 10a) as illustrated in FIG. 1 through FIG. 9. The process 250 of forming the sealing layer may include a process 202 of forming an underfill layer, a process 210 of performing base molding, a process 220 of forming a solder extrusion prevention layer, and a process 230 of performing annealing. In some embodiments, the process 202 of forming the underfill layer is omitted to reduce assembly costs. The process 230 of performing annealing may refer to a thermal treatment.

Figure 23:
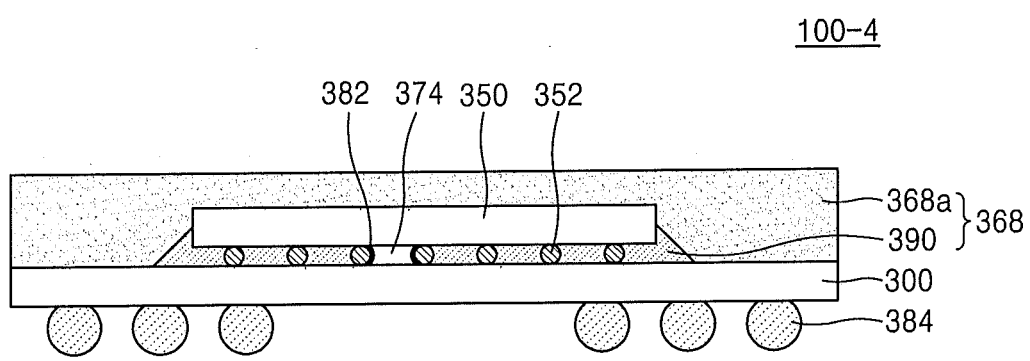
FIG. 23 is a cross-sectional view of a semiconductor package according to an exemplary embodiment of the inventive concept.

As illustrated in FIG. 23, the process 202 of forming the underfill layer may be forming an underfill layer 390 between the wiring substrate 300 and the solder 352, and may be forming a void 374 between the solders 352 within the underfill layer 390. In some embodiments, the process 202 of forming the underfill layer 390 is omitted. When the process of forming the underfill layer is not performed, a molding layer may also be formed between the wiring substrate 300 and the solder 352.

In the process 210 of performing base molding, the chip mounted on the wiring substrate 10 by using the solders 36 (or 36a) may be sealed by a molding material to form the sealing layer 42, and the void 38 of FIG. 1 through FIG. 9 may be formed between the solders 36 (or 36a). The process 250 of forming the sealing layer 42 will be described below in detail.

The process 220 of forming the solder extrusion prevention layer may be forming the solder extrusion prevention layer 40 (or 40a) of FIG. 1 through FIG. 9 on one sidewall of one solder 36 (or 36a) exposed by the void 38. The process 220 of forming the solder extrusion prevention layer 40 (or 40a) will be described below in detail.

The process 230 of performing annealing may be annealing the solders 36 (or 36a), the sealing layer 42, and the solder extrusion prevention layer 40 (or 40a) mounted on the wiring substrate 10. The annealing may improve a connection force between the solders 36 (or 36a) and the first solder pads 16 (or 16a) mounted on the wiring substrate 10 and improve a mechanical bonding force therebetween.

The respective processes of a method of manufacturing a semiconductor package according to an embodiment of the inventive concept will be described below with reference to FIG. 11 through FIG. 22.

Figure 11:
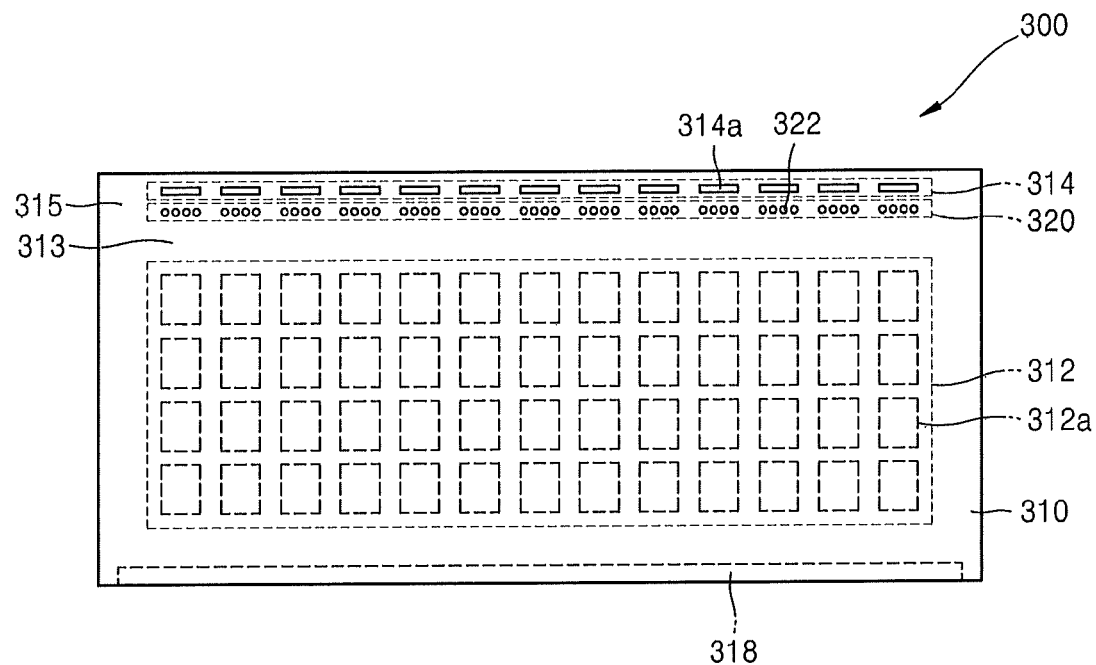
FIG. 11, FIG. 12 and FIG. 13 are diagrams of a process of mounting a chip on a wiring substrate, according to an embodiment of the inventive concept.
Figure 12:
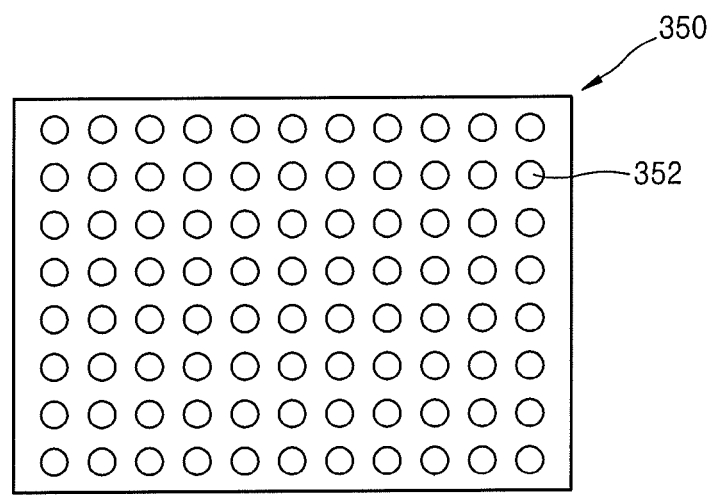
Figure 13:
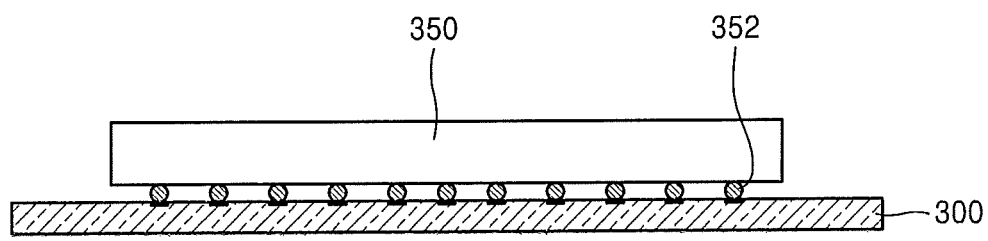

FIG. 11 through FIG. 13 are diagrams of a process of mounting a chip on a wiring substrate in a method of manufacturing a semiconductor package, according to an embodiment of the inventive concept.

Specifically, FIG. 11 is a plan view of a wiring substrate 300. The wiring substrate 300 of FIG. 11 may correspond to the wiring substrate 10 (or 10a) of FIG. 1 through FIG. 9. The wiring substrate 300 may be a strip type wiring substrate. FIG. 12 is a plan view of a wiring substrate 300 that may be mounted on the wiring substrate 300. The chip 350 of FIG. 12 may correspond to the chip 50 of FIG. 1 through FIG. 9. FIG. 12 may be a plan view of a bottom surface of the chip 250, (e.g. a portion in which the solders 352 are formed). The solders 352 of FIG. 12 may correspond to the solders 36 (or 36a) of FIG. 1 through FIG. 9.

The wiring substrate 300 of FIG. 11 may be a PCB. The wiring substrate 300 may be a strip type wiring substrate on which a plurality of chips 350 are mounted. The wiring substrate 300 may include a substrate body 310. The substrate body 310 may correspond to the substrate body 12 of FIG. 1 through FIG. 9. FIG. 11 illustrates a first surface of the substrate body 310, for example, a top surface of the substrate body 310. The internal wiring line 18 of FIG. 1 and FIG. 4 may be formed within the substrate body 310. The solder mask layer 14a (or 14a-1) of FIG. 1 through FIG. 9 may be formed on the substrate body 310.

A chip mounting region 312 having a plurality of chip mounting portions 312a, on which the chip 350 is mounted, may be formed on the substrate body 310. The chip mounting region 312 may be formed in the central portion of the substrate body 310. A penetration region 314 having a plurality of through-holes 314a passing through the substrate body 310 may be formed in one side of a peripheral portion 313 of the chip mounting region 312. The peripheral portion 313 may refer to a portion of the top surface of the substrate body 310, except for a portion in which the chip mounting region 312 is formed.

Figure 14:
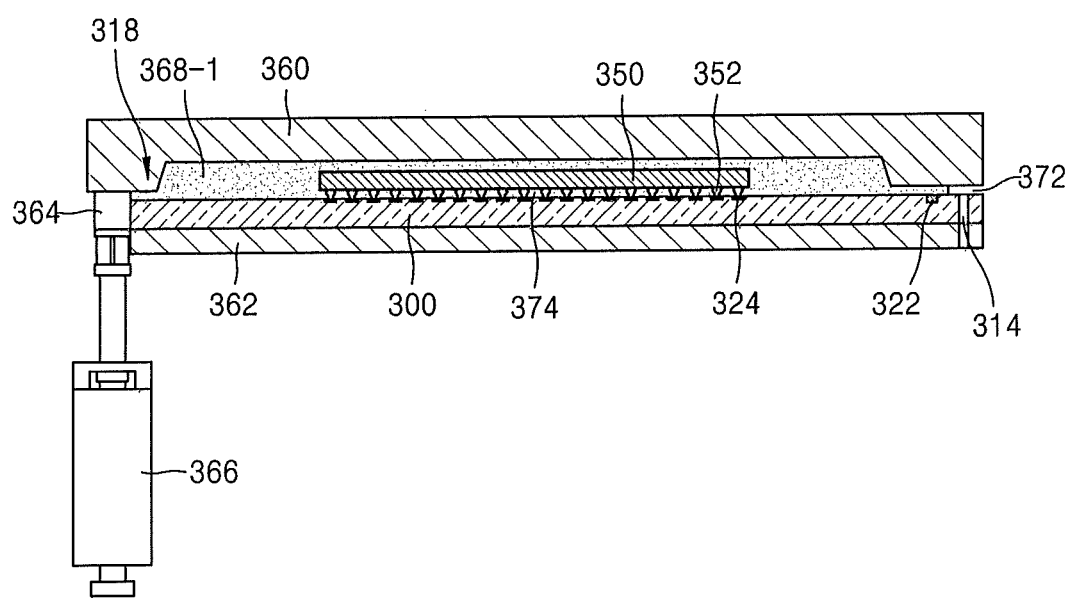
FIG. 14, FIG. 15, FIG. 16A and FIG. 16B are diagrams of a process of base-molding a chip mounted on a wiring substrate, according to an embodiment of the inventive concept.

The penetration region 314 may be defined in at least one outermost portion 315 of the substrate body 310. The outermost portion 315 may be positioned within the peripheral portion 313 and may refer to a portion adjacent to an edge of the top surface of the substrate body 310. The penetration region 314 may be defined in the outermost portion 315 of the substrate body 310 opposite to a molding material injection hole 318 of FIG. 14, which will be described below. The molding material injection hole 318 of FIG. 14 is an injection hole through which a molding material is injected in the molding process for forming the sealing layer of the chips 350 mounted on the wiring substrate 300.

The penetration region 314 may include through-holes 314a separate from one another. The through-holes 314a may be formed to have a circular shape or a polygonal shape, such as a triangular shape, a rectangular shape, or a diamond shape. As described below, the penetration region 314 may be formed so as to improve a flow of the molding material in the molding process of the chips 350 mounted on the wiring substrate 300.

The wiring substrate 300 may include a marking region 320 that marks, (as either good or bad), the quality of the chips on the top surface of the substrate body 310 between the chip mounting region 312 and the penetration region 314. The marking region 320 may include a plurality of marking patterns 322 separate from one another. The penetration region 314 may be formed in the outermost portion of the substrate body 310 toward the outside of the marking region 320.

The marking region 320 is a region in which the quality of the chip 350 is marked when the semiconductor chip is mounted on the wiring substrate 300. The quality is marked as either good or bad. The marking region 320 may be a region used to mark the quality of the chip 350 based on a result obtained by inspecting the chip 350 with a vision camera in a marking process among the package manufacturing processes. In some embodiments, the marking region 320 is omitted.

FIG. 13 is a cross-sectional view in which the chip 350 is mounted on the solder pad 324 of the wiring substrate 300. For convenience, FIG. 13 illustrates an embodiment in which only one chip 350 is mounted on the wiring substrate 300. The same principles illustrated in FIG. 13 will apply when multiple chips 350 are mounted on the wiring substrate 300. The chip 350 may be mounted on the wiring substrate 300 by using the solders 352. As illustrated in FIG. 12, the solders 352 may be densely arranged in horizontal and vertical directions. FIG. 14 through FIG. 16B are diagrams of a process of base-molding a chip mounted on a wiring substrate in the method of manufacturing a semiconductor package, according to an embodiment of the inventive concept.

Figure 15:
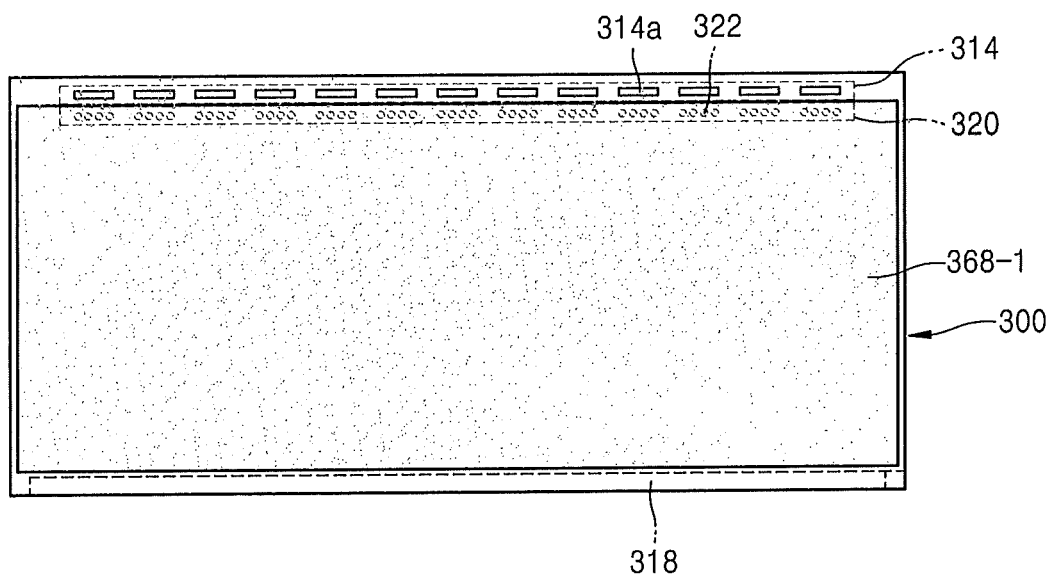
Figure 16A:
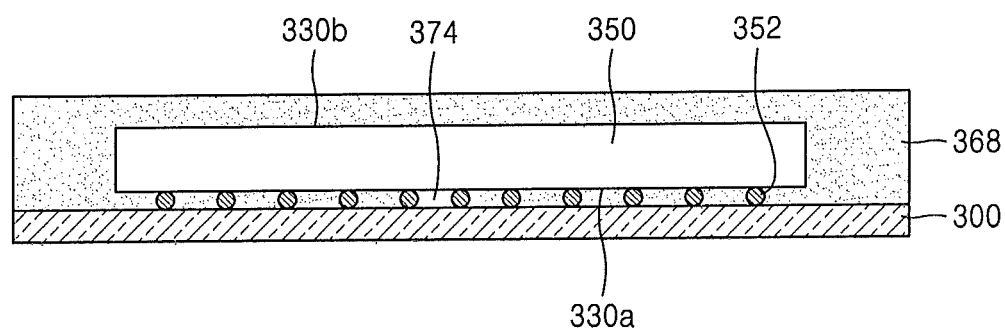
Figure 16B:
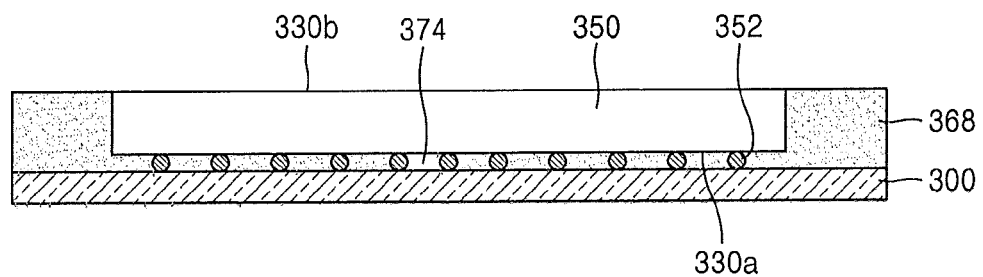

Specifically, FIG. 14 through FIG. 16B are diagrams describing a process of forming a sealing layer 368 using a molding material 368-1. FIG. 14 and FIG. 15 are a cross-section view and a plan view, respectively, describing a process of forming a sealing layer 368 by base-molding a wiring substrate 300, on which at least one chip 350 is mounted, by using a molding material injection apparatus 366. The sealing layer 368 may correspond to the sealing layer 42 of FIG. 1 through FIG. 9. FIG. 16A and FIG. 16B are cross-sectional views of a state in which the sealing layer 368 is formed after the base molding of the wiring substrate 300 on which the chip 350 is mounted.

After the chip 350 is mounted on the wiring substrate 300 as described above with reference to FIG. 13, the base molding process is performed so as to form the sealing layer 368. For convenience, the base molding process of FIG. 14 will be described with reference to a single chip 350. In other words, a plurality of chips 350 are mounted on the wiring substrate 300, but the base molding process of FIG. 14 will be described with reference to a case where only one chip 350 is mounted.

The base molding process may be performed at a temperature of about 150° C. to about 200° C. In the base molding process, first, a wiring substrate 300, in which a solder 352 of a chip 350 is mounted on a solder pad 324, is placed between an upper mold 360 and a lower mold 362. A molding source 364 is positioned at one side of the wiring substrate 300, and a molding material 368-1 is injected into a cavity space between the upper mold 360 and the lower mold 362 through a molding material injection hole 318 by using a molding material injection apparatus 366. The molding material 368-1 may include a polymer such as a resin. For example, the molding material 368-1 may include an epoxy molding compound (EMC).

When the molding material 368-1 is injected into the cavity space, air is suctioned through an air vent hole 372 at the side of the upper and lower molds 360 and 362 opposite from the molding material injection apparatus 366, such that the molding material 368-1 is made to flow from one side to the other side of the wiring substrate 300.

When the molding material 368-1 is injected, the flow of the molding material 368-1 may not be smooth due to the chip 350 and the solder 352. When the flow of the molding material 368-1 is not smooth, the void 38 of FIG. 1 through FIG. 9 may be formed within the molding material 368-1. If the molding material 368-1 covers the top surface of the marking region 320 so as to improve the flow of the molding material 368-1, it may be impossible to inspect the marking pattern 322 marking good/bad quality of the semiconductor chip with the vision camera in the marking process among the package manufacturing processes. In this case, the above problem may be solved by generating indicators for the quality of the chip 350 mounted on the wiring substrate 300 as map data in a separate apparatus and transmitting the map data to a marking apparatus.

In order to improve the flow of the molding material 368-1, the penetration region 314 having the through-holes 314a may be provided in the outermost portion 315 of the wiring substrate 300 as described above. In the lower mold 362, molding through-holes may be formed corresponding to the through-holes 314a of the wiring substrate 300. When the through-holes 314a are formed in the outermost portion 315 of the wiring substrate 300, air is suctioned through the through-holes 314a as well as the air vent hole 372 at the other sides of the upper and lower molds 360 and 362, such that the molding material 368-1 is made to more smoothly flow from one side to the other side of the wiring substrate 300.

Through the base molding process, the sealing layer 369 may be formed by sealing the chip 350 and the solder 352 mounted on the wiring substrate 300 by using the molding material 368-1 as illustrated in FIG. 16A and FIG. 16B.

The sealing layer 368 may include a molded underfill (MUF) type molding material that is sealed while filling a space between the chip 350 and the wiring substrate 300. The sealing layer 368 may be formed between the solders 352 and between the wiring substrate 300 and the chip 350. The sealing layer 368 may be formed between the first surface 330a of the chip, (e.g. the active surface), and the wiring substrate 300. As illustrated in FIG. 16A, the sealing layer 368 may cover the second surface 330b of the chip 350, (e.g. the inactive surface). As illustrated in FIG. 16B, the sealing layer 368 may not cover entirely cover the second surface 330b of the chip 350.

As described above, the void 374 may be formed within the sealing layer 368 as illustrated in FIG. 16A and FIG. 16B. The void 374 may correspond to the void 38 of FIGS. 1 to 9. The void 374 may be inevitably formed even when the flow of the molding material 368-1 is made smooth through the above-described configuration. In a case where the void 374 is formed, the adjacent solders may be short-circuited when the solders 352 is melted in use.

Figure 17:
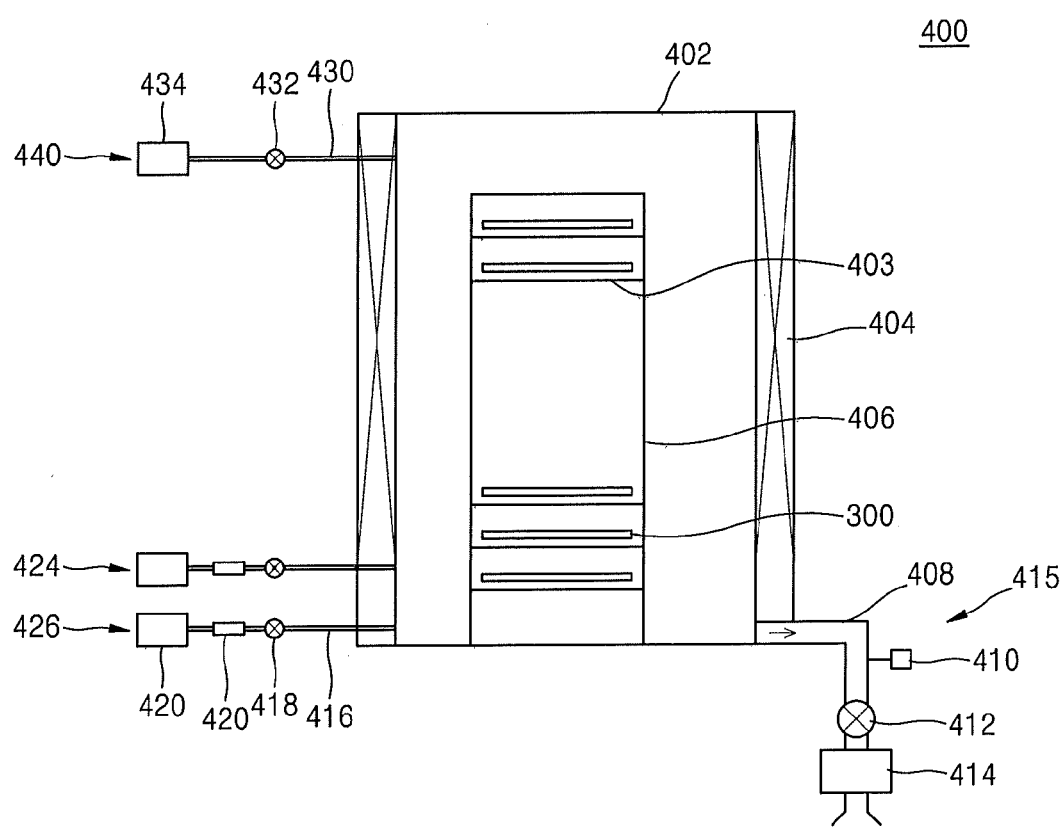
FIG. 17 is a schematic view of a package manufacturing apparatus that performs a process of forming a solder extrusion prevention layer and an annealing process in the method of manufacturing a semiconductor package, according to an embodiment of the inventive concept.

FIG. 17 is an example of the package manufacturing apparatus that performs the process (step 220 in FIG. 10) of forming the solder extrusion prevention layer and the annealing process (step 230 in FIG. 10). The package manufacturing apparatus 400 of FIG. 17 is only for illustrative purposes and may be modified in a variety of ways.

The package manufacturing apparatus 400 may be a furnace or a film deposition apparatus. The package manufacturing apparatus 400 may include a chamber 402 installed in a vertical direction. In the chamber 402, a substrate accommodation portion 406 may be installed such that a wiring substrate 300 with a chip 350 mounted thereon is loaded thereon. The substrate accommodation portion 406 may include a plurality of vertical substrate supports 403. A plurality of wiring substrates 300 may be accommodated on the substrate supports 403 in a horizontal direction in multiple stages.

A pressurization unit 440 may be installed in the chamber 402. The pressurization unit 440 may include an air supply pipe 430, an valve 432 (which can be opened or closed), and an air supply pump 434. The air supply pipe 430, which constitutes the pressurization unit 440, may be installed on one side of an upper portion of the chamber 402. The installation position of the air supply pipe 430 may be variously changed. The opening/closing valve 432 and the air supply pump 434 may be connected to the air supply pipe 430. Air, which is supplied by the air supply pump 434, may be controlled by the valve 432. The valve 432 and the air supply pump 434 may be controlled by an apparatus control unit (not illustrated).

An exhaust unit 415 may be installed in one side of a lower portion of the chamber 402. The exhaust unit 415 may include an exhaust pipe 408, a pressure sensor 410, an auto pressure controller (APC) valve 412, and an exhaust pump 414. The exhaust pipe 408, which constitutes the exhaust unit 415 and exhausts the internal atmosphere of the chamber 402, may be connected to one side of the lower portion of the chamber 402.

The pressure sensor 410, and the APC valve 412 as a pressure adjustment valve, and the exhaust pump 414 may be installed in the exhaust pipe 408 in this order from upstream. The exhaust pump 414 may be configured to exhaust the chamber 402 such that the inside of the chamber 402 becomes a predetermined pressure. The APC valve 412 and the pressure sensor 410 may be used for pressure control by the apparatus control unit (not illustrated). The apparatus control unit (not illustrated) may control the opening or closing of the APC valve 412, based on the pressure detected by the pressure sensor 410, such that the inside of the chamber 402 becomes a desired pressure.

Outside of the chamber 402, a heater 404 may be installed as a heating mechanism that heats the inside of the chamber 402. The heater 404 may include an electrical resistance heater such as a carbon heater. A temperature sensor (not illustrated) may be installed in the chamber 402. The apparatus control unit (not illustrated) may control the temperature of the chamber 402 by using the heater 404 and the temperature sensor (not illustrated).

A plurality of gas injection units, including a first gas injection unit 424 and a second gas injection unit 426, may be installed in a lower portion of the other side of the chamber 402. Each of the gas injection units 424 and 426 may include a gas supply pipe 416, an valve 418, a flow rate controller 420, and a gas supply source 422. The gas supply pipes 416, which constitute the gas injection units 424 and 426, may be connected to the other side of the lower portion of the chamber 402. The gas supply source 422 supplying reaction gas, the flow rate controller 420 such as a mass flow controller (MFC), and the opening/closing valve 418 may be connected to the gas supply pipe 416. The flow rate controller 420 and the opening/closing valve 418 may control the reaction gas supplied to the chamber 402 under the control of the apparatus control unit (not illustrated).

Oxygen gas may be injected to the chamber 402 through the gas injection units 424 and 426. Purge gas, for example, nitrogen gas, may be injected to the chamber 402 through the gas injection units 424 and 426. In addition, different gases may be injected to the first gas injection unit 424 and the second gas injection unit 426. When a silicon nitride layer is formed on one side of the solder as described above, dichlorosilane (DCS) gas may be injected to the first gas injection unit 424 and ammonia gas may be injected to the second gas injection unit 426.

FIG. 18 through FIG. 21 are diagrams of a process for forming a solder extrusion prevention, according to an embodiment of the inventive concept.

Figure 18:
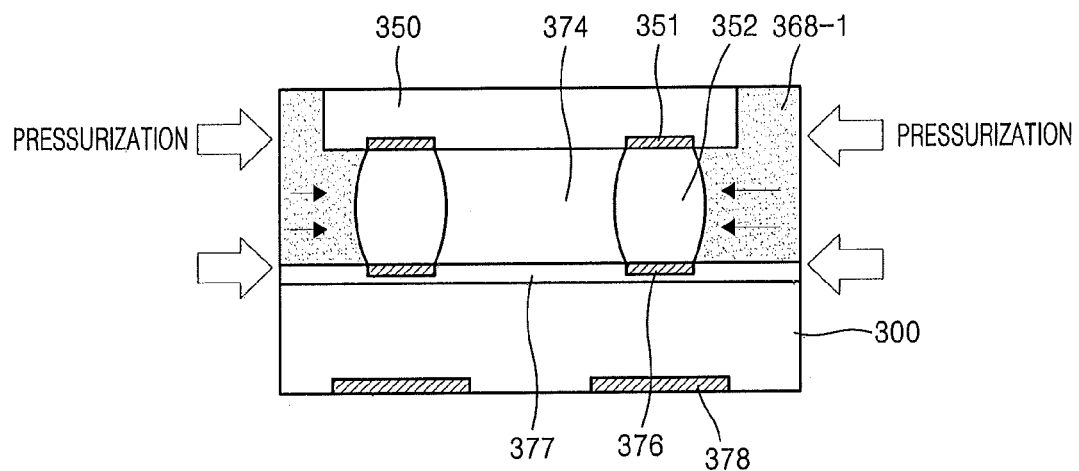
FIG. 18, FIG. 19, FIG. 20 and FIG. 21 are diagrams of a process of forming a solder extrusion prevention layer, according to an embodiment of the inventive concept.
Figure 19:
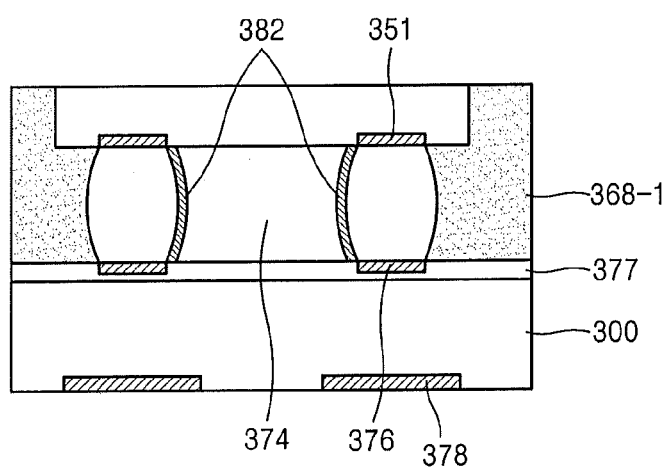
Figure 20:
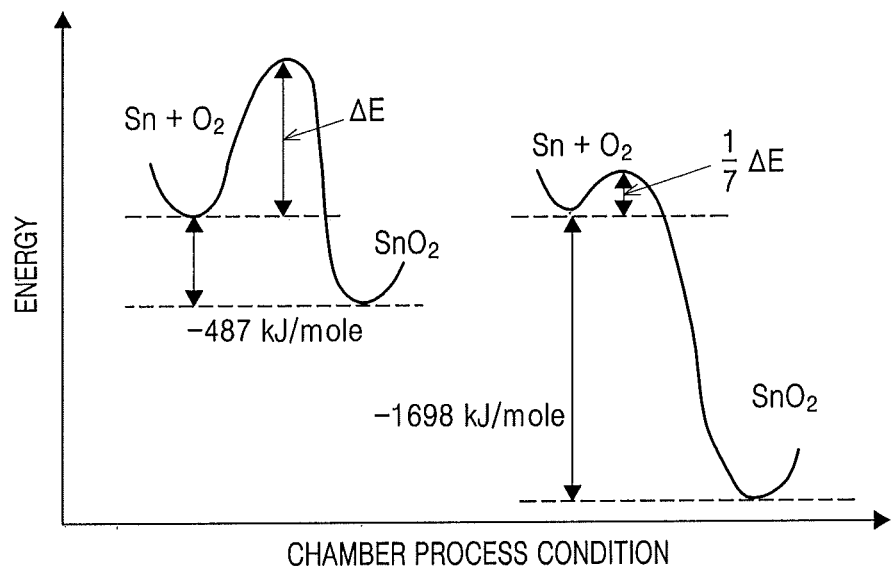
Figure 21:
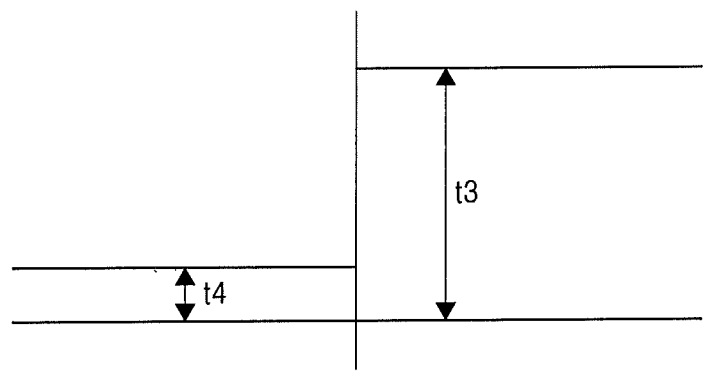

Specifically, FIG. 18 and FIG. 19 are cross-sectional views of a process for forming a solder extrusion prevention layer 382 on one sidewall of a solder 352 of a chip 350 mounted on a wiring substrate 300. The solder extrusion prevention layer 382 may correspond to the solder extrusion prevention layer 40 or 40a of FIG. 1 through FIG. 9. FIG. 20 and FIG. 21 are diagrams describing the theoretical background of formation of the solder extrusion prevention layer 382 illustrated in FIG. 18 and FIG. 19.

With reference to FIG. 18 and FIG. 19, a first solder pad 376 and a first solder mask layer 377 may be formed on a wiring substrate 300. The first solder pad 376 may correspond to the first solder pad 16 (or 16a) of FIG. 1 through FIG. 9. The first solder mask layer 377 may correspond to the first solder mask layer 14a (or 14a-1) of FIG. 1 through FIG. 9. A second solder pad 378 may be formed on the bottom surface of the wiring substrate 300.

The second solder pad 378 may correspond to the second solder pad 20 of FIG. 1 through FIG. 9. A chip 350 may be mounted on the wiring substrate 300 by using solders 352. The solders 352 and the chip 350 on the wiring substrate 300 may be sealed by a molding material 368-1. As described above, a void 374 may be formed between the adjacent solders 352. Although not illustrated in FIG. 18 and FIG. 19, a solder protection layer 44 of FIG. 7 may be formed on one sidewall of the solder 352.

The chip 350, which is mounted on the wiring substrate 300 by using the solders 352, (in which the void 374 is formed between the solders 352), may be loaded into the chamber 402 of the package manufacturing apparatus 400 of FIG. 17.

Subsequently, the void 374 is pressurized by adjusting a temperature of the chamber 402 of the package manufacturing apparatus 400 to below a melting point of the solder 352, (e.g. about 150° C. to about 200° C.), and maintaining the chamber 402 at a pressure higher than an atmospheric pressure, (e.g. about 1.5 atmosphere to 7 atmosphere) for a predetermined time, (e.g. about one to two hours). In this way, as illustrated in FIG. 19, one sidewall of the solder 352 exposed by the void 374 may be oxidized and a solder extrusion prevention layer 382 made of an oxide layer may be formed.

The solder extrusion prevention layer 382 may correspond to the solder extrusion prevention layer 40 or 40a of FIG. 1 through FIG. 9. The solder extrusion prevention layer 382 may be formed by adjusting the temperature of the chamber 402 of the package manufacturing apparatus 400 to below the melting point of the solder 352 and injecting oxygen gas.

When the temperature of the chamber 402 of the package manufacturing apparatus 400 is adjusted to below the melting point of the solder 352 and nitride layer forming gas, (e.g.

DCS gas or ammonia gas), is injected into the chamber 402, the gas may be injected through the molding material 368-1, and thus, the solder extrusion prevention layer 382 may be formed as the nitride layer.

A thickness of the solder extrusion prevention layer 382 according to a chamber process condition of the package manufacturing apparatus 400 will be described in detail with reference to FIG. 20 and FIG. 21.

FIG. 20 is a diagram of a thermodynamic energy according to a chamber process condition, (e.g. a pressure of the chamber 402). The left graph of FIG. 20 illustrates a case where the pressure of the chamber 402 is 1 atm, (which is equal to the atmospheric pressure), and the temperature of the chamber 402 is 175° C., which is below the melting point of the solder 352, for example, tin (Sn). The right graph of FIG. 20 illustrates a case where the pressure of the chamber 402 is 7 atm, (which is higher than the atmospheric pressure), and the temperature of the chamber 402 is 175° C., which is below the melting point of the solder 352, for example, tin (Sn). The right graph of FIG. 20 is a case where 7 atm is applied to the void 374 between the solders 352 on the wiring substrate 300 within the chamber 402.

As illustrated in the left graph of FIG. 20, when the pressure of the chamber 402 is the atmospheric pressure, a thermodynamic force may be about 487 kJ/mole and an activation energy barrier necessary for movement from tin to an oxide layer, that is, a tin oxide layer may be $\Delta E$. As illustrated in the right graph of FIG. 20, when the pressure of the chamber 402 is 7 atm higher than the atmospheric pressure, a thermodynamic force may be about 1,698 kJ/mole and an activation energy barrier necessary for movement from tin to an oxide layer, that is, a tin oxide layer may be $\Delta E/7$.

When the pressure of the chamber 402 is 7 atm higher than the atmospheric pressure, the thermodynamic force may be about 3.5 times higher and the response speed may be about 7 times faster, as compared to the case where the pressure of the chamber 402 is 1 atm. Furthermore, the pressure of the chamber 402 may act on the void 374 of FIG. 18 and FIG. 19 and the oxygen pressure inside the void may also be equally increased.

Therefore, as illustrated in FIG. 21, when the pressure of the chamber 402 is the atmospheric pressure, the solder extrusion prevention layer 382 may be formed to have a thickness of t4, for example, a small thickness of about 20 nm to about 30 nm, on one sidewall of the solder 352 exposed by the void 374 on the wiring substrate 300. As illustrated in FIG. 21, when the pressure of the chamber 402 is 7 atm higher than the atmospheric pressure, the solder extrusion prevention layer 382 may be formed to have a thickness of t3, for example, a large thickness of about 140 nm to about 210 nm, on one sidewall of the solder 352 exposed by the void 374 on the wiring substrate 300.

Figure 22:
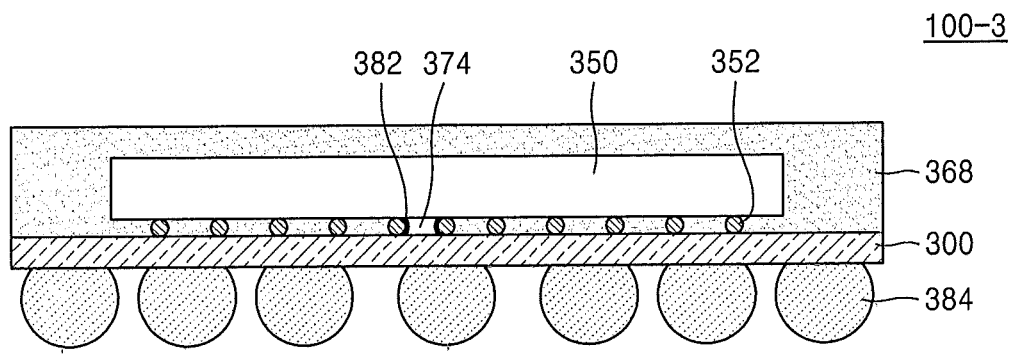
FIG. 22 is a cross-sectional view of an annealing process and a process of forming an external connection terminal, according to an embodiment of the inventive concept.

FIG. 22 is a cross-sectional view of an annealing process and a process of forming an external connection terminal, according to an embodiment of the inventive concept.

After the solder extrusion prevention layer 382 is formed, an annealing process (step 230 of FIG. 10) may be performed on the wiring substrate 300, in which the chip 35 is mounted using the solders 352, in the chamber 402 of the package manufacturing apparatus 400. The annealing may refer to curing. The annealing process may be performed with a pressure of the chamber 402 at atmospheric pressure and the temperature of the chamber 402 is about 150° C. to about 200° C., which is below the melting point of the solder 352, for example, tin (Sn). Due to the annealing, the solder 352 may be tightly connected to the wiring substrate 300 in a mechanical and electrical manner.

Subsequently, an external connection terminal 384 may be formed on the rear surface of the wiring substrate 300. The external connection terminal 384 may correspond to the external connection terminal 22 of FIG. 1 through FIG. 9. The external connection terminal 384 may be formed by a solder. Using the above-described processes, a semiconductor package 100-3 may be formed.

With reference to FIG. 23, the semiconductor package 100-4 may be substantially the same as the semiconductor package 100-3 of FIG. 22, except that a sealing layer 368 is formed by an underfill layer 390 and a molding layer 368a. Therefore, the elements in common with FIG. 22 and FIG. 23 will not be described or will be described briefly.

In the semiconductor package 100-4, a chip 350 may be mounted on a wiring substrate 300 by using solders 352. An underfill layer 390 may be injected between the solders 352a and between the wiring substrate 300 and the chip 350.

The underfill layer 390 may be formed by injecting an underfill material between the wiring substrate 300 and the chip 350. The underfill layer 390 may include an epoxy resin, a silica filler, or a flux. A molding layer 368a may be formed on both sides of the chip 350 toward the outside of the underfill layer 390. The underfill layer 390 and the molding layer 368a may be formed using the same material. Consequently, a sealing layer 368 may be formed by the underfill layer 390 and the molding layer 368a.

In the semiconductor package 100-4, as described above, a void 374 may be formed between the adjacent solders 352 within the underfill layer 390. A solder extrusion prevention layer 382 may be formed on one sidewall of the solder 352 exposed by the void 374. As described above, the solder extrusion prevention layer 382 may prevent the solders 352 from being short-circuited.

Figure 24:
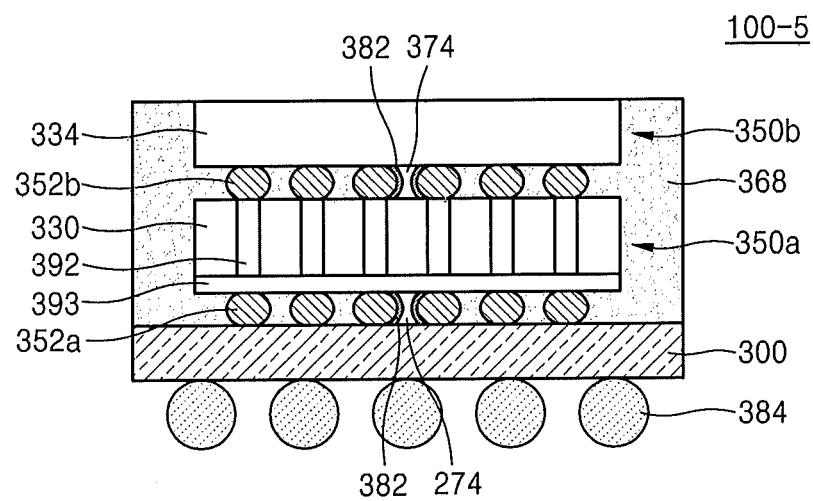
FIG. 24 is a cross-sectional view of a semiconductor package according to an embodiment of the inventive concept.

With reference to FIG. 24, the semiconductor package 100-5 may be substantially the same as the semiconductor package 100-3 of FIG. 22, except that a first chip 350a and a second chip 350b are stacked on a wiring substrate 300 and are connected together through a through-silicon via 392 within the first chip 350a. Therefore, the elements in common with FIG. 22 and FIG. 24, will not be described or will be described briefly.

In the semiconductor package 100-5, a first chip 350a may be mounted on a wiring substrate 300 by using solders 352a. A through-silicon via 392 may be formed within a chip body 330 constituting the first chip 350a. A plurality of through-silicon vias 392 may be formed within the first chip 350a. A protection layer 393 may be formed on the bottom surface of the chip body 330. The through-silicon vias 392 may be electrically connected to the first solder 352a.

A second chip 350b may be mounted on the first chip 350a through second solders 352b. The second chip 350b, which is connected to the through-silicon vias 392, may be stacked on the first chip 350a through the second solders 352b in a flip chip type. The second chip 350b is a chip stacked on the uppermost portion, and no through-silicon vias may be formed in the second chip 350b.

The first chip 350a and the second chip 350b may be semiconductor chips that perform various functions, such as memories, logics, microprocessors, analog devices, digital signal processors, and system-on-chips.

The semiconductor package 100-5 is illustrated as including two stacked chips 350a and 350b, but may have a structure in which two or more chips are stacked as necessary. The chips 350a and 350b may be the same type of memory chips. In addition, the first chip 350a may be a memory chip and the second chip 350b may be a microcontroller chip.

A sealing layer 368 may be formed to seal the first chip 350a and the second chip 350b mounted on the wiring substrate 300. The sealing layer 368 may be formed between the first and second solders 352a and 352b respectively, between the wiring substrate 300 and the first chip 350a, and between the first chip 350a and the second chip 350b.

In the semiconductor package 100-5, as described above, the voids 374 may be formed between the adjacent first solders 352a formed between the wiring substrate 300 and the first chip 350a and between the adjacent second solders 352b formed between the first chip 350a and the second chip 350b. A solder extrusion prevention layer 382 may be formed on one sidewall of the solders 352a and 352b exposed by the voids 374. As described above, the solder extrusion prevention layer 382 may prevent the solders 352a and 352b from being short-circuited.

Figure 25:
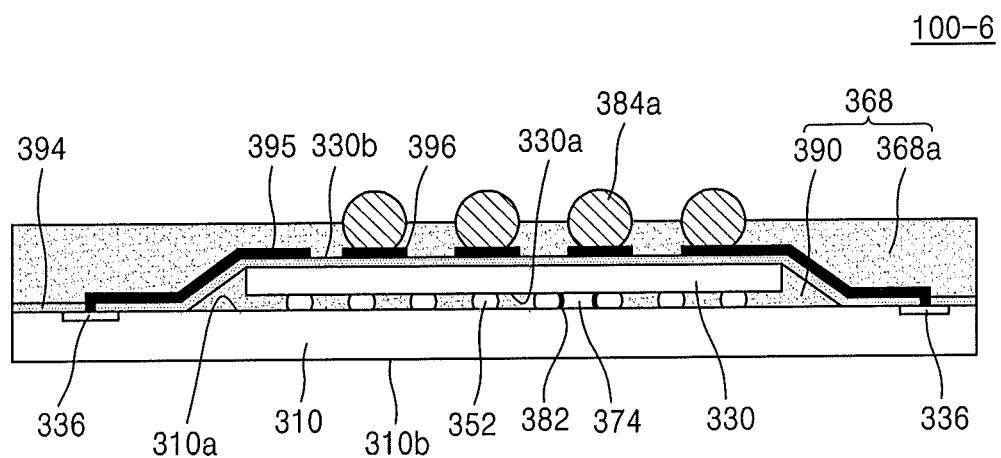
FIG. 25 is a cross-sectional view of a semiconductor package according to an embodiment of the inventive concept.

With reference to FIG. 25, the semiconductor package 100-6 may be substantially the same as the semiconductor package 100-4 of FIG. 23, except that an external connection terminal 384a is formed toward a first surface 310a of a substrate body 310 constituting a wiring substrate 300. Therefore, elements in common with FIG. 23 and FIG. 25 will not be described or will be described briefly.

In the semiconductor package 100-6, a chip 350 may be mounted on a wiring substrate 300 by using solders 352. A substrate body 310, which constitutes the wiring substrate 300, may have a first surface 310a and a second surface 310b opposite to the first surface 310a. The first surface 310a may correspond to the first surface 12a of FIG. 1 through FIG. 9. The second surface 310b may correspond to the second surface 12b of FIG. 1 through FIG. 9. A connection pad 336 may be formed on the first surface 310a of the substrate body 310.

The chip 350 may include a chip body 330. The chip body 330 may correspond to the chip body 30 of FIG. 1 through FIG. 9. The chip body 330 may have a first surface 330a and a second surface 330b opposite to the first surface 330a. The first surface 330a may correspond to the first surface 32a of FIG. 1 through FIG. 9. The second surface 330b may correspond to the second surface 32b of FIG. 1 through FIG. 9.

An underfill layer 390 may be buried between solders 352 on the substrate body 310 and between the substrate body 310 and the chip 350. A rewiring insulation layer 394 may be formed on the underfill layer 390, the second surface 330b of the chip body 330, and the first surface 310a of the substrate body 310. A rewiring layer 395, which is connected to a connection pad 336 formed on the first surface 310a of the substrate body 310, may be formed on the rewiring insulation layer 394.

That is, the rewiring layer 395, which is connected to the connection pad 336, may be formed on the underfill layer 390 and the first surface 310a of the substrate body 310. A rewiring solder pad 396 may be formed in a portion of the rewiring layer 395. A molding layer 368a may be formed on the underfill layer 390 to seal the chip 350 and the rewiring layer 395. Therefore, a sealing layer 368 may be formed by the underfill layer 390 and the molding layer 368a. An external connection terminal 384a may be formed in the rewiring solder pad 396.

In the semiconductor package 100-6, as described above, a void 374 may be formed between the adjacent solders 352 within the underfill layer 390. A solder extrusion prevention layer 382 may be formed on one sidewall of the solder 352 exposed by the void 374. As described above, the solder extrusion prevention layer 382 may prevent the solders 352 from being short-circuited.

Hereinafter, examples of application of the semiconductor packages according to the embodiments of the inventive concept will be described. While examples are provides, it should be understand that the scope of this disclosure comprehends variations that would be considered by one skilled in the art.

Figure 26:
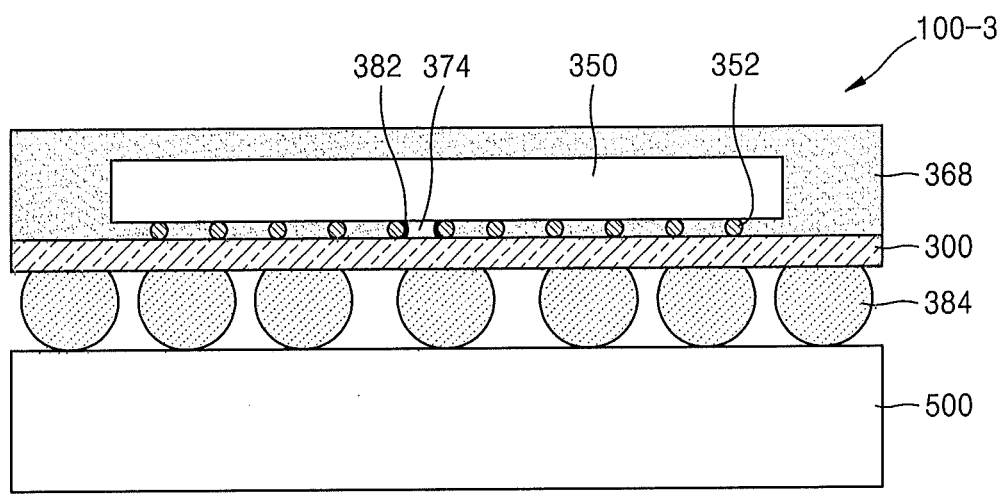
FIG. 26 is a cross-sectional view of an application example of a semiconductor package according to an embodiment of the inventive concept.

With reference to FIG. 26, the semiconductor package 100-3 according to the embodiment of the inventive concept may be mounted on a mother substrate 500. After the semiconductor package 100-3 is mounted on the mother substrate 500, a reflow process may be performed for connection between the external connection terminal 384 and the mother substrate 500. The reflow process attaches and connects the external connection terminal 384 of the semiconductor package 100-3 to the mother substrate 500 by melting the solders constituting the external connection terminal 384. The reflow process may refer to a process of performing soldering by melting the external connection terminal 384.

Even though the reflow process is performed, the semiconductor package 100-3 according to the inventive concept may prevent the solders 352 from being short-circuited because the solder extrusion prevention layer 382 is formed on one sidewall of the solder 352 exposed by the void 374.

Figure 27:
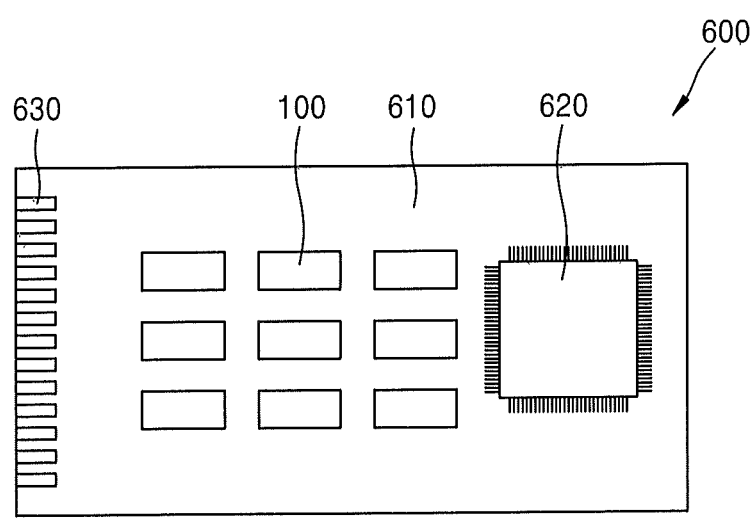
FIG. 27 is a schematic diagram illustrating a configuration of a package module using a semiconductor package, according to an embodiment of the inventive concept.

With reference to FIG. 27, the semiconductor package 100 according to the embodiment of the inventive concept may be applied to a package module 600. The package module 600 may include a plurality of semiconductor packages 100 attached to a module substrate 610. The package module 600 may include a control semiconductor package 620 attached to one side, and an external connection terminal 630 at the other side. The semiconductor package 100 according to the embodiment of the inventive concept is not limited to the above example, and may be applied to various package modules 600.

Figure 28:
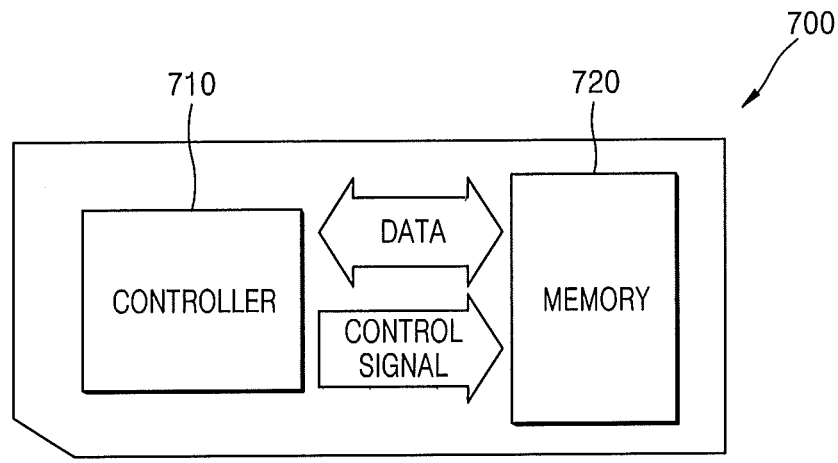
FIG. 28 is a schematic diagram illustrating a configuration of a memory card using a semiconductor package, according to an embodiment of the inventive concept.

With reference to FIG. 28, the semiconductor package 100 according to the embodiment of the inventive concept may be applied to a memory card 700. The memory card 700 may include various types of cards, for example, a memory stick card, a smart media (SM) card, a secure digital (SD) card, a mini SD card, or a multi media card (MMC).

The memory card 700 may include a controller 710 and a memory 720. Examples of the memory 720 may include a flash memory, a phase-change random access memory (PRAM), and other non-volatile memory. The controller 710 may transmit a control signal to the memory 720, and data may be exchanged between the controller 710 and the memory 720. As described above, the semiconductor package 100 according to the embodiment of the inventive concept may employ the controller 710 and the memory 720 constituting the memory card 700.

Figure 29:
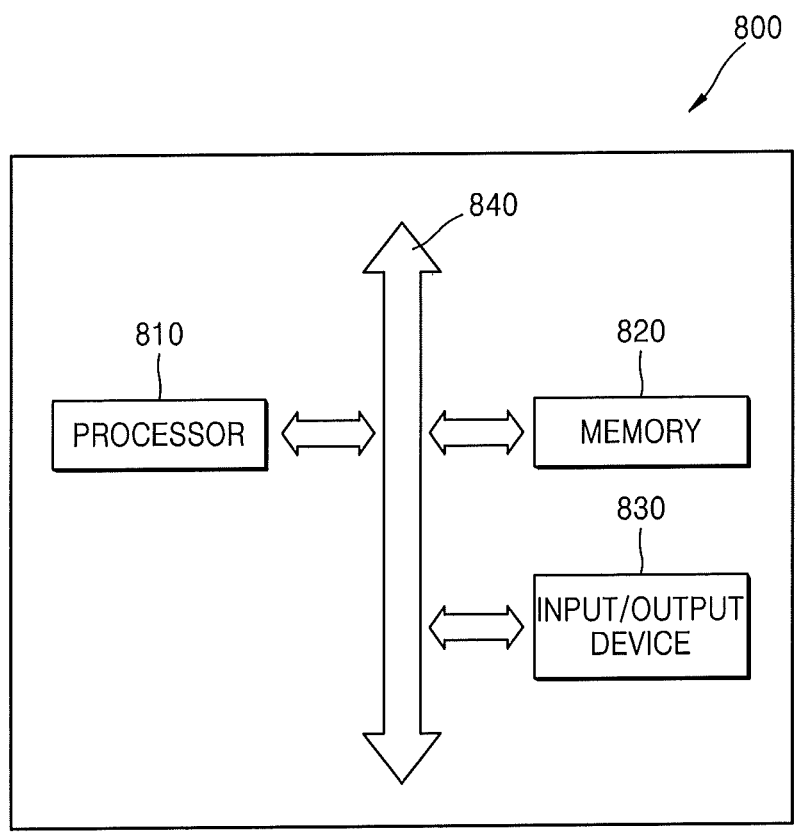
FIG. 29 is a schematic diagram illustrating a configuration of an electronic system using a semiconductor package, according to an embodiment of the inventive concept.

Referring to FIG. 29, the electronic system 800 according to the embodiment of the inventive concept may be a mobile system or an information transmitting/receiving system. Examples of the mobile system may include a personal digital assistant (PDA), a web tablet, a wireless phone, a mobile phone, a digital music player, or a memory card.

The electronic system 800 according to the embodiment of the inventive concept may include a processor 810, a memory 820, and an input/output device 830. The processor 810 may transmit or receive a control signal or data to or from memory 820 or the input/output device 830 through a bus 840.

The processor 810 may execute a program and control the electronic system 800. The processor 810 may be a microprocessor, a digital processor, a microcontroller, or other devices similar thereto. The input/output device 830 may be used to input or output data of the electronic system 800.

The electronic system 800 may be connected to an external device, for example, a personal computer or a network, through the input/output device 830 to exchange data with the external device. Examples of the input/output device 830 may include a keypad, a keyboard, or a display. The memory 820 may store codes and/or data for operations of the processor 810, and/or data processed by the processor 810. The processor 810 and the memory 820 may include the semiconductor package 100 according to any one of the embodiments of the inventive concept. The bus 840 may be a data transmission path between the electronic system 800 and an external device. The processor 810, the input/output device 830, and the memory 820 may communicate with one another through the bus 840.

Figure 30:
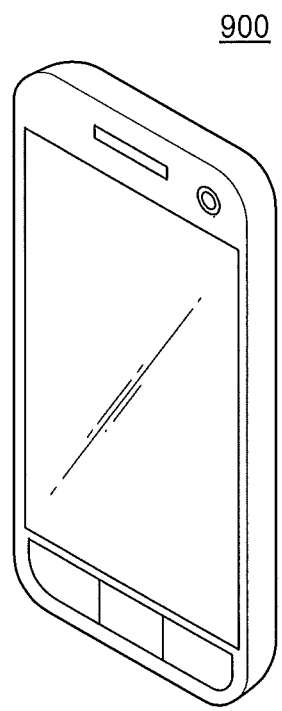
FIG. 30 is a perspective view of an electronic device to which a semiconductor package is applicable, according to an embodiment of the inventive concept.

FIG. 30 illustrates an example in which the electronic system of FIG. 29 is applied to a mobile phone 900. In addition, the electronic system 800 may also be applied to a portable notebook computer, an MP3 player, a navigation device, a solid state disk (SSD), a vehicle, or household appliances.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a wiring substrate including a plurality of solder pads;
   a chip including a plurality of chip pads connected to the solder pads through a plurality of solders;
   a sealing layer configured to seal the chip and the solders, at least one void being between the solders; and
   a solder extrusion prevention layer on one sidewall of the solder exposed by the at least one void.

2. The semiconductor package of claim 1, wherein the sealing layer comprises a molding layer between the solders and between the wiring substrate and the chip.

3. The semiconductor package of claim 1, wherein the sealing layer comprises:
   an underfill layer between the solders and between the wiring substrate and the chip; and
   a molding layer on each of a plurality of sides of the chip circumscribing the underfill layer.

4. The semiconductor package of claim 1, wherein the solder extrusion prevention layer is on facing sidewalls of the solders exposed by the at least one void.

5. The semiconductor package of claim 1, further comprising a solder mask layer defined by the solder pads on the wiring substrate,
   wherein the solder extrusion prevention layer is on one sidewall of the solder mask layer contacting the at least one void.

6. The semiconductor package of claim 1, further comprising a solder mask layer on the wiring substrate and having an opening having a diameter that is larger than a diameter of the solder pad,
   wherein the at least one void is between the solder mask layer and the solder, and the solder extrusion prevention layer is on one sidewall of the solder pad exposed by the at least one void.

7. The semiconductor package of claim 1, wherein the solder extrusion prevention layer comprises a material having a higher melting point than the solder.

8. The semiconductor package of claim 1, wherein the chip is a first chip including a plurality of through-silicon vias, and a second chip is stacked on the first chip, the second chip connected to the through-silicon vias through a plurality of second solders.

9. The semiconductor package of claim 1, further comprising a metal layer on the solder pad and the chip pad.

10. A semiconductor package comprising:
    a wiring substrate including a plurality of first solder pads on a first surface of a substrate body, and a first solder mask layer having an opening to expose the plurality of first solder pads;
    a chip including an active surface facing the first surface of the substrate body and having a plurality of chip pads;
    a plurality of solders configured to connect the first solder pads to the respective chip pads;
    a sealing layer between the solders on the wiring substrate and between the wiring substrate and the chip configured to seal the chip, at least one void being between the solders; and
    a solder extrusion prevention layer on one sidewall of the solder exposed by the at least one void.

11. The semiconductor package of claim 10, wherein the opening has a smaller diameter than a diameter of the first solder pad, and the solder is circumscribed by the opening.

12. The semiconductor package of claim 11, wherein the solder extrusion prevention layer is on an inner wall of the opening adjacent to the at least one void.

13. The semiconductor package of claim 12, wherein the solder extrusion prevention layer is on facing sidewalls of the solders exposed by the at least one void and is on the inner wall of the opening adjacent to the at least one void.

14. The semiconductor package of claim 10, wherein the opening has a larger diameter than a diameter of the first solder pad, forming a gap portion wherein the first surface of the substrate body is not contacting the solder, and the sealing layer is on the substrate body of the gap portion between the first solder pad and the first solder mask layer.

15. The semiconductor package of claim 10, further comprising a second solder pad exposed by a second solder mask layer on a second surface of the substrate body opposite to the first surface of the substrate body, and connected to the first solder pad through an internal wiring line,
    wherein an external connection terminal is connected to the second solder pad.

16. The semiconductor package of claim 10, wherein the sealing layer comprises:
    an underfill layer between the solders and between the wiring substrate and the chip; and
    a molding layer on the underfill layer and a plurality of sides of the chip.

17. The semiconductor package of claim 16, further comprising a rewiring layer on the underfill layer and the first surface of the substrate body and connected to a connection pad on the first surface of the substrate body,
    wherein a rewiring solder pad is in a portion of the rewiring layer, and
    an external connection terminal is connected to the rewiring solder pad.

18. A semiconductor package comprising:
    a wiring substrate having a plurality of solder pads;
    a chip including a plurality of chip pads connected to the solder pads through a plurality of solders;
    a sealing layer between the solders on the wiring substrate and between the wiring substrate and the chip to seal the chip, at least one void being between the solders;
    a solder extrusion prevention layer exposed by the at least one void and on one sidewall of the solder; and
    a solder protection layer not exposed by the at least one void and on the other sidewall of the solder.

19. The semiconductor package of claim 18, wherein the solder extrusion prevention layer is thicker than the solder protection layer.

20. The semiconductor package of claim 18, wherein the solder protection layer is in contact with the sealing layer.

* * * * *